(12) United States Patent
Müller

(10) Patent No.: US 12,075,625 B2
(45) Date of Patent: Aug. 27, 2024

(54) MEMORY CELL, CAPACITIVE MEMORY STRUCTURE, AND METHODS THEREOF

(71) Applicant: Ferroelectric Memory GmbH, Dresden (DE)

(72) Inventor: Stefan Ferdinand Müller, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 0 days.

(21) Appl. No.: 18/114,643

(22) Filed: Feb. 27, 2023

(65) Prior Publication Data

US 2023/0247842 A1 Aug. 3, 2023

Related U.S. Application Data

(63) Continuation of application No. 17/085,449, filed on Oct. 30, 2020, now abandoned.

(51) Int. Cl.
*H10B 51/30* (2023.01)
*H01L 29/423* (2006.01)
*H01L 29/51* (2006.01)
*H01L 29/66* (2006.01)
*H01L 29/78* (2006.01)
(Continued)

(52) U.S. Cl.
CPC ............ *H10B 51/30* (2023.02); *H01L 28/60* (2013.01); *H01L 29/42392* (2013.01); *H01L 29/516* (2013.01); *H01L 29/6684* (2013.01); *H01L 29/78391* (2014.09); *H01L 29/7851* (2013.01); *H01L 29/78696* (2013.01)

(58) Field of Classification Search
CPC ....... H10B 51/30; H10B 53/30; H01L 29/516; H01L 29/78391; H01L 28/75
See application file for complete search history.

(56) References Cited

U.S. PATENT DOCUMENTS

| 5,719,520 A | 2/1998 | Au |
| 5,963,805 A | 10/1999 | Kang |
| 6,479,862 B1 | 11/2002 | King |

(Continued)

FOREIGN PATENT DOCUMENTS

| CN | 106537509 A | 3/2017 |
| CN | 113948114 A | 1/2021 |

(Continued)

OTHER PUBLICATIONS

Massoud Pedram, "Leakage Power Modeling and Minimization". University of Southern California, Dept. of EE Systems, Los Angeles, CA 90089, ICCAD 2004 Tutorial, www.ceng.usc.edu, Oct. 10, 2007, 43 pages.

(Continued)

*Primary Examiner* — Vincent Wall
(74) *Attorney, Agent, or Firm* — Viering, Jentschura & Partner mbB

(57) ABSTRACT

According to various aspects a memory cell is provided, the memory cell including: a first electrode; a second electrode; and a memory layer disposed between the first electrode and the second electrode, wherein the memory layer includes a first memory portion having a first concentration of oxygen vacancies and a second memory portion having a second concentration of oxygen vacancies different from the first concentration of oxygen vacancies.

16 Claims, 12 Drawing Sheets

(51) Int. Cl.
  *H01L 29/786* (2006.01)
  *H01L 49/02* (2006.01)

(56) References Cited

U.S. PATENT DOCUMENTS

| | | | |
|---|---|---|---|
| 6,559,459 B2 | 5/2003 | Paz De Araujo | |
| 6,559,469 B1* | 5/2003 | Paz de Araujo | C23C 16/448 |
| | | | 257/17 |
| 7,709,359 B2 | 5/2010 | Boescke | |
| 8,304,823 B2 | 11/2012 | Boeschke | |
| 9,053,802 B2 | 6/2015 | Muller | |
| 9,558,804 B2 | 1/2017 | Muller | |
| 9,608,111 B2 | 3/2017 | Ramaswamy | |
| 10,438,645 B2 | 10/2019 | Müller | |
| 10,460,788 B2 | 10/2019 | Müller | |
| 10,622,051 B2 | 4/2020 | Müller | |
| 10,650,892 B2 | 5/2020 | Noack | |
| 10,978,129 B1 | 4/2021 | Muller | |
| 11,024,357 B1 | 6/2021 | Mizusaki | |
| 11,049,541 B2 | 6/2021 | Muller | |
| 11,081,159 B1 | 8/2021 | Jahne | |
| 11,101,291 B2 | 8/2021 | Mennenga | |
| 11,158,361 B2 | 10/2021 | Muller | |
| 11,189,331 B1 | 11/2021 | Benoist | |
| 11,195,589 B1 | 12/2021 | Ocker | |
| 11,289,145 B2 | 3/2022 | Ocker | |
| 11,309,034 B2 | 4/2022 | Mennenga | |
| 11,309,792 B2 | 4/2022 | Iqbal | |
| 11,309,793 B2 | 4/2022 | Iqbal | |
| 11,335,391 B1 | 5/2022 | Ocker | |
| 2001/0034106 A1* | 10/2001 | Moise | H01L 21/32136 |
| | | | 257/E21.314 |
| 2001/0036101 A1 | 11/2001 | Schlosser | |
| 2001/0044205 A1* | 11/2001 | Gilbert | H10B 53/00 |
| | | | 438/653 |
| 2001/0051436 A1 | 12/2001 | Kim | |
| 2002/0163072 A1 | 11/2002 | Gupta | |
| 2003/0132469 A1* | 7/2003 | Moon | H10B 53/30 |
| | | | 257/295 |
| 2004/0042290 A1* | 3/2004 | Tarui | H01L 29/40111 |
| | | | 257/E21.208 |
| 2004/0129987 A1 | 7/2004 | Uchiyama | |
| 2004/0237998 A1* | 12/2004 | Hall | G03F 7/42 |
| | | | 134/28 |
| 2005/0088878 A1 | 4/2005 | Eshel | |
| 2005/0230725 A1* | 10/2005 | Aggarwal | H10B 53/00 |
| | | | 257/295 |
| 2005/0244988 A1* | 11/2005 | Wang | H10B 53/30 |
| | | | 257/E21.664 |
| 2005/0280105 A1 | 12/2005 | Andreoni | |
| 2008/0081380 A1* | 4/2008 | Celii | H01L 28/75 |
| | | | 257/E21.001 |
| 2008/0217738 A1* | 9/2008 | Wang | H01L 28/75 |
| | | | 257/532 |
| 2010/0085806 A1 | 4/2010 | Wang | |
| 2010/0258794 A1 | 10/2010 | Iwasaki | |
| 2014/0254275 A1 | 9/2014 | Shuto | |
| 2014/0355328 A1 | 12/2014 | Muller | |
| 2015/0070964 A1 | 3/2015 | Yamada | |
| 2015/0340372 A1 | 11/2015 | Pandey | |
| 2016/0005961 A1 | 1/2016 | Ino | |
| 2016/0268271 A1 | 9/2016 | Mueller | |
| 2017/0076775 A1 | 3/2017 | Mueller | |
| 2017/0154999 A1 | 6/2017 | Ramaswamy | |
| 2017/0256552 A1 | 9/2017 | Schröder | |
| 2017/0365719 A1* | 12/2017 | Chen | H01L 29/40111 |
| 2018/0226417 A1 | 8/2018 | Ando | |
| 2018/0350824 A1* | 12/2018 | Tao | H10N 70/021 |
| 2019/0129992 A1 | 5/2019 | Ewen | |
| 2019/0130956 A1* | 5/2019 | Müller | H01L 29/0673 |
| 2019/0130957 A1 | 5/2019 | Muller | |
| 2019/0131347 A1 | 5/2019 | Lee | |
| 2019/0273087 A1 | 9/2019 | Morris | |
| 2020/0176610 A1 | 6/2020 | Lee | |
| 2020/0212168 A1 | 7/2020 | Yoo | |
| 2020/0273865 A1* | 8/2020 | Manipatruni | H01L 28/90 |
| 2020/0357455 A1 | 11/2020 | Noack | |
| 2020/0357470 A1 | 11/2020 | Noack | |
| 2021/0026601 A1 | 1/2021 | Kobayashi | |
| 2021/0028180 A1 | 1/2021 | Yamaguchi | |
| 2021/0036100 A1 | 2/2021 | Lu | |
| 2021/0091097 A1 | 3/2021 | Mennenga | |
| 2021/0312969 A1 | 10/2021 | Noack | |
| 2021/0327901 A1 | 10/2021 | Noack | |
| 2021/0375890 A1 | 12/2021 | Chia | |
| 2021/0391457 A1 | 12/2021 | Zaka | |
| 2022/0020776 A1 | 1/2022 | Mennenga | |
| 2022/0122995 A1 | 4/2022 | Ocker | |
| 2022/0122996 A1 | 4/2022 | Ocker | |
| 2022/0122999 A1 | 4/2022 | Polakowski | |
| 2022/0139931 A1 | 5/2022 | Ocker | |
| 2022/0139932 A1 | 5/2022 | Polakowski | |
| 2022/0139933 A1 | 5/2022 | Noack | |
| 2022/0139934 A1 | 5/2022 | Muller | |
| 2022/0139936 A1 | 5/2022 | Ocker | |
| 2022/0139937 A1 | 5/2022 | Muller | |

FOREIGN PATENT DOCUMENTS

| | | |
|---|---|---|
| CN | 113496720 A | 10/2021 |
| CN | 113539319 A | 10/2021 |
| CN | 113948115 A | 1/2022 |
| CN | 113948494 A | 1/2022 |
| CN | 113948581 A | 1/2022 |
| DE | 120008024519 B4 | 12/2009 |
| EP | 1134803 A1 | 9/2001 |
| EP | 1143525 A1 | 10/2001 |
| EP | 3701562 A1 | 9/2020 |
| JP | H1168057 A | 3/1999 |
| TW | 201917870 A | 5/2019 |
| TW | 201944411 A | 11/2019 |
| WO | 2001071816 A1 | 9/2001 |
| WO | 2019081117 A1 | 5/2019 |
| WO | 2019206619 A1 | 10/2019 |
| WO | 20190206619 A1 | 10/2019 |
| WO | 2021140193 A1 | 7/2021 |
| WO | 20220083898 A1 | 4/2022 |

OTHER PUBLICATIONS

Junction Leakage and Gidl, "Reserve Biased Diode Current (Junction Leakage)", https://asicsos.blogspot.com/20018/04/reverse-biased-diode-current-junction.html last viewed on Jul. 15, 2020 3 pages.

Jan M. Rabaey, Anantha Chandrakasan and Borivoje Nikoloc, "Digital integrated Circuits A Design Perspective", 2nd Edition, dated 2005, Prentice Hall, 448 pages (in 3 parts).

BSIM4.2.1 MOSFET Model, Department of Electrical Engineering and Computer Sciences University of California, Berkeley, dated 2001, 1 page.

Subthreshold Conduction, Mar. 21, 2020, p. 1.

Bruyere S. et al., "Review on high-K Dielectrics Reliability Issues", IEEE Transactions on Device and Materials Reliability, IEEE Service Center, vol. 5, No. 1, dated Mar. 1, 2005 pp. 5-19.

Tilke et al., highly Scalable Embedded Flash Memory with Deep Trench Isolation and Novel Buried Bitline Integration for the 90-nm Node and Beyond, IEEE, vol. 54 No. 7, dated Jul. 2007.

Shum et al., "Highly Scalable Flash Memory Embedded into High-Performance CMOS for the 90 nm Node & beyond", ICSICT_2006, Shanghai, China, 4 pages.

Shum et al., "Highly Scalable Flash Memory with Novel Deep Trench Isolation Embedded into High-Performance CMOS for the 90nm Node & Beyond", dated 2005 IEEE, 4 pages.

TW 107135787, office action dated on or about Aug. 15, 2019,in the Chinese language.

English translation of TW 107135787, office action dated on or about Aug. 15, 2019.

TW 107135787, Notice of Allowance, dated on or about Jan. 7, 2020, in the Chinese language.

(56) References Cited

OTHER PUBLICATIONS

PCT/EP2018/074611, Written Opinion of the International Searching Authority dated Nov. 12, 2018.
PCT/EP2021/050261, Written Opinion of the International Searching Authority dated Mar. 9, 2021.
PCT/EP2021/057968, Written Opinion of the International Searching Authority dated Dec. 15, 2021.
PCT/EP2018/074611, International Search Report dated Nov. 12, 2018.
PCT/EP2021/050261, International Search Report dated Mar. 9, 2021.
PCT/EP2021/057968, International Search Report dated Dec. 15, 2021.
Ho et al., "Morphology and crystallization kinetics in HfO2 thin films grown by atomic layer deposition", Journal of Applied Physics vol. 93, No. 3, Feb. 1, 2003, pp. 1477-1481 (Year: 2003)("Ho").
Fan, et al. "Ferroelectric HfO2-based material for next generation ferroelectric memories", Journal of Adv. Dielec., vol. 6, No. 2 (2016) 1630003 ("Fan").
Work_Function (https://en.wikipedia.org/wiki/work_function)("Work_Function").
Dr. Joseph Elias, Adjunct Faculty University of Kentucky, Department of Electrical and Computer Engineering, Class 07: Layout and Rules, http://web.engr.uky.edu/~elias/lectures/ln_07.pdf, Feb. 4, 2002 (Year:2002) ("Elias").
Vincent Wall, Final Rejection in U.S. Appl. No. 17/072,077, filed Jul. 27, 2022.
Vincent Wall, Final Rejection in U.S. Appl. No. 17/085,141, filed Aug. 7, 2023.
Vincent Wall, Final Rejection in U.S. Appl. No. 17/072,079, filed Oct. 3, 2022.
Vincent Wall, Final Rejection in U.S. Appl. No. 17/085,449, filed Nov. 30, 2022.
Vincent Wall, Final Rejection in U.S. Appl. No. 17/085,175, filed Dec. 27, 2022.
Vincent Wall, Non Final Rejection in U.S. Appl. No. 17/072,077, filed Jan. 26, 2022.
Vincent Wall, Non Final Rejection in U.S. Appl. No. 17/085,449, filed Jul. 15, 2022.
Vincent Wall, Non Final Rejection in U.S. Appl. No. 17/085,175, filed Jul. 25, 2022.
Steven M. Christopher, Non Final Rejection in U.S. Appl. No. 17/085,141, filed Sep. 7, 2022.
Vincent Wall, Non Final Rejection in U.S. Appl. No. 18/117,357, filed Nov. 27, 2023.
Vincent Wall, Requirement for Restriction/Election in U.S. Appl. No. 18/117,357, filed Sep. 13, 2023.

* cited by examiner

MEMORY CELL, CAPACITIVE MEMORY STRUCTURE, AND METHODS THEREOF

CROSS-REFERENCE TO RELATED APPLICATION(S)

This application is a Continuation of U.S. patent application Ser. No. 17/085,449, filed Oct. 30, 2020, which is hereby incorporated by reference in its entirety.

TECHNICAL FIELD

Various aspects relate to a memory cell and methods thereof, e.g. a method for processing a memory cell.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. By way of example, a type of memory cell may include a thin film of ferroelectric material, whose polarization state may be changed in a controlled fashion to store data in the memory cell, e.g. in a non-volatile manner. The memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
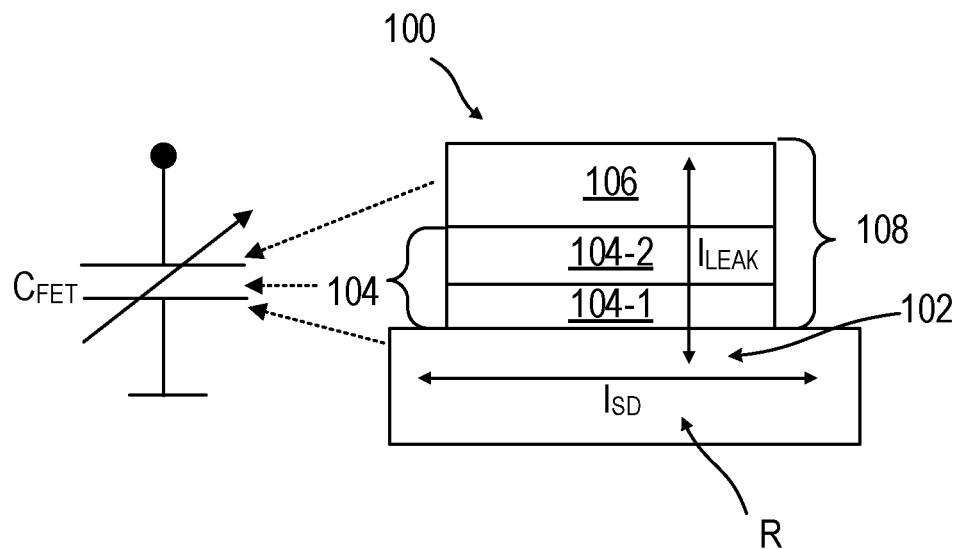
FIG. 1 shows schematically a field-effect transistor structure, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one field-effect transistor (FET) structure. In some aspects, a memory cell may include a field-effect transistor structure and a capacitive memory structure (also referred to herein as memory capacitor) coupled to a gate electrode of the field-effect transistor structure. The amount of charge stored in the capacitive memory structure may influence the threshold voltage(s) of the field-effect transistor structure. The threshold voltage(s) of the field-effect transistor structure may define the memory state the memory cell is residing in. In some aspects, the capacitive memory structure may be a ferroelectric capacitor structure (FeCAP) coupled to a gate electrode of the field-effect transistor structure to provide a ferroelectric field-effect transistor (FeFET) structure. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. A ferroelectric material may turn a ferroelectric capacitor structure into a non-volatile capacitor based memory structure, e.g. by controlling the amount of charge stored in the capacitor structure. In other aspects, a non-volatile memory technology may be based on at least one capacitive memory structure. The capacitive memory structure may be or may include a ferroelectric capacitor structure. The amount of charge stored in the capacitive memory structure may be read out by suitable electronic read out circuits, e.g., by a charge to voltage converter, by a determination of a switching current of the capacitive memory structure.

Doped or substituted hafnium oxide ($HfO_2$), doped or substituted zirconium oxide ($ZrO_2$) or, more in general, transition metal oxides (TMO) and their mixtures may show large remanent polarization under certain process conditions (e.g., $Hf_{0.5}Zr_{0.5}O_2$ may possess strong ferroelectric properties). Electrical properties and, more specifically, ferroelectric or polarization properties of these TMOs are known to depend strongly on the stoichiometry and/or sub-stoichiometry of the material, in particular on the amount of oxygen vacancies (Vo) which are present in the film. An oxygen vacancy may be understood as a missing oxygen atom at a certain lattice site. The oxygen vacancies may have very high concentrations, e.g. in the range from $10^{20}$ cm$^{-3}$ to $10^{22}$ cm$^{-3}$. Oxygen vacancies are known to impact a crystal in various ways, for example by inducing distortion of the crystal lattice and stabilization of different crystal phases, or by inducing the formation of defect dipoles. Ferroelectricity of a film may be influenced by the accumulation of oxygen vacancies at an interface.

Oxygen vacancies may often result from processing conditions, or due to scavenging of oxygen by the electrode neighboring an insulator (e.g., neighboring the polarizable material) in a memory cell. As an example, the ferroelectric properties of hafnium oxide may be influenced by an oxygen flow during physical vapor deposition. As another example, the ferroelectric properties of hafnium oxide may be influenced by a pulse time of ozone. As a further example, Si—Al doping may introduce stresses in a film that support crystal phase formation. Template layers or scavenging elements neighboring or inside a film may be used to provide crystal texture, interface reduction, and/or mono-crystallinity in the film. The formation of vacancies may thereby be not properly controlled, and may lead to uncontrolled variations in a memory film (e.g., may lead to changes in the polarizability of the material). As an example, in the fabrication of a RRAM there may be a control over oxygen vacancies inside an insulator film, however with the aim of forming a conducting path from a top electrode to a bottom electrode via the oxygen vacancies, which is instead to be avoided in a memory cell based on remanent-polarization since it would lead to an increased leakage current which may deteriorate the data retention capabilities of the memory cell.

Various aspects may be based on providing a memory cell including a memory layer, in which oxygen vacancies are provided (e.g., introduced) in a controlled manner to positively influence the memory properties of the memory cell (e.g., to increase the polarizability of the memory layer, to facilitate the switching of a polarization state, to provide faster switching, as examples). In some aspects, electrical dipoles may be formed at specific locations. In some aspects, movement of oxygen vacancies in a capacitor structure may be controlled. In various aspects, the positioning of oxygen vacancies may support the formation of a remanent-polarizable crystal structure.

FIG. 1 shows a schematic functioning of a field-effect transistor structure 100, according to various aspects. The field-effect transistor structure 100 may include a gate structure 108, wherein the gate structure 108 may include a gate isolation 104 and a gate electrode 106. The gate structure 108 is illustrated exemplarily as a planar gate stack; however, it may be understood that the planar configuration shown in FIG. 1 is an example, and other field-effect transistor designs may include a gate structure 108 with a non-planar shape, for example a trench gate transistor design, a vertical field-effect transistor design, or other designs as exemplarily shown in FIG. 3D and FIG. 3E, as examples. The gate structure 108 may define a channel region 102, e.g., provided in a semiconductor portion (e.g., in a semiconductor layer, in a semiconductor die, etc.). The gate structure 108 may allow for a control of an electrical behavior of the channel region 102. The gate structure 108 may, for example, be used to control (e.g., allow or prevent) a current flow in the channel region 102. In some aspects, the gate structure 108 may, for example, allow to control (e.g., allow or prevent) a source/drain current, $I_{SD}$, from a first source/drain region of the field-effect transistor structure 100 to a second source/drain region of the field-effect transistor structure 100 (the source/drains are provided in or adjacent to the channel but are not shown in FIG. 1). The channel region 102 and the source/drain regions may be formed, e.g., via doping one or more semiconductor materials or by the use of intrinsically doped semiconductor materials, within a layer and/or over a layer. In some aspects, the gate structure 108 may control (e.g., increase or reduce) an electrical resistance, R, of the channel region 102 and, accordingly, control the amount of current that may flow through the channel region 102. With respect to the operation of the field-effect transistor structure 100, a voltage (illustratively an electrical potential) may be provided at (e.g., supplied to) the gate electrode 106 to control the current flow, $I_{SD}$, in the channel region 102, the current flow, $I_{SD}$, in the channel region 102 being caused by voltages supplied via the source/drain regions.

The gate electrode 106 may include an electrically conductive material, for example, polysilicon, aluminum, etc. In some aspects, the gate electrode 106 may include any suitable electrically conductive material, e.g., a metal, a metal alloy, a degenerate semiconductor (in other words a semiconductor material having such a high level of doping that the material acts like a metal and not anymore as a semiconductor). According to various aspects, the gate electrode 106 may include one or more electrically conductive portions, layers, etc. The gate electrode 106 may include, for example, one or more metal layers (also referred to as a metal gate), one or more polysilicon layers (also referred to as poly-Si-gate), etc. A metal gate may include, for example, at least one work-function adaption metal layer disposed over the gate isolation 104 and an additional metal layer disposed over the work-function adaption metal layer. A poly-Si-gate may be, for example, p-type doped or n-type doped.

According to various aspects, the gate isolation 104 may be configured to provide an electrical separation of the gate electrode 106 from the channel region 102 and further to influence the channel region 102 via an electric field generated by the gate electrode 106. The gate isolation 104 may include one or more electrically insulating portions, layers, etc., as described in more detail below.

Some designs of the gate isolation 104 may include at least two layers including different materials, e.g., a first gate isolation layer 104-1 (e.g., a first dielectric layer including a first dielectric material) and a second gate isolation layer 104-2 (e.g., a second dielectric layer including a second dielectric material distinct from first dielectric material). The second gate isolation layer 104-2 may be disposed over the first gate isolation layer 104-1. Illustratively, the first gate isolation layer 104-1 may be disposed closer to the channel region 102 of the field-effect transistor structure 100 with respect to the second gate isolation layer 104-2. The first gate isolation layer 104-1 may be disposed directly on the channel region 102 and may provide an interface for forming the second gate isolation layer 104-2. In some aspects, the first gate isolation layer 104-1 may be referred to as a buffer layer.

As illustrated by the circuit equivalent in FIG. 1, a first capacitance, $C_{FET}$, may be associated with the field-effect transistor structure 100. Illustratively, the channel region 102, the gate isolation 104, and the gate electrode 106 may have a capacitance, $C_{FET}$, associated therewith, originating from the more or less conductive regions (the channel region 102 and the gate electrode 106) separated from one another by the gate isolation 104. Further illustratively, the channel region 102 may be considered as a first capacitor electrode, the gate electrode 106 as a second capacitor electrode, and the gate isolation 104 as a dielectric medium between the two capacitor electrodes. The capacitance, $C_{FET}$, of the field-effect transistor structure 100 may define one or more operating properties of the field-effect transistor structure 100. The configuration of the field-effect transistor structure 100 (e.g., of the gate isolation 104) may be adapted according to a desired behavior or application of the field-effect transistor structure 100 during operation (e.g., according to a desired capacitance), as described in further detail below.

In general, the capacitance, C, of a planar capacitor structure may be expressed as, $$C = \varepsilon_0 \varepsilon_r \frac{A}{d},$$

with $\varepsilon_0$ being the relative permittivity of the vacuum, A being the effective area of the capacitor, d being the distance of the two capacitor electrodes from one another, and $\varepsilon_r$ being the relative permittivity of the dielectric material disposed between two capacitor electrodes assuming that the whole gap between the two capacitor electrodes is filled with the dielectric material. It is noted that the capacitance of a non-planar capacitor structure or of a modified variant of a planar capacitor structure may be calculated based on equations known in the art.

According to various embodiments, a memory cell may be provided, for example, by coupling a gate of a field-effect transistor structure with a capacitive memory structure, or by integrating a memory structure in the gate structure of a field-effect transistor structure (as shown, for example, in FIG. 2 and FIG. 3A to FIG. 3E).

The influence of the capacitance of a field-effect transistor structure on the performance of a memory cell including a capacitive memory structure are described in further detail below.

Figure 2:
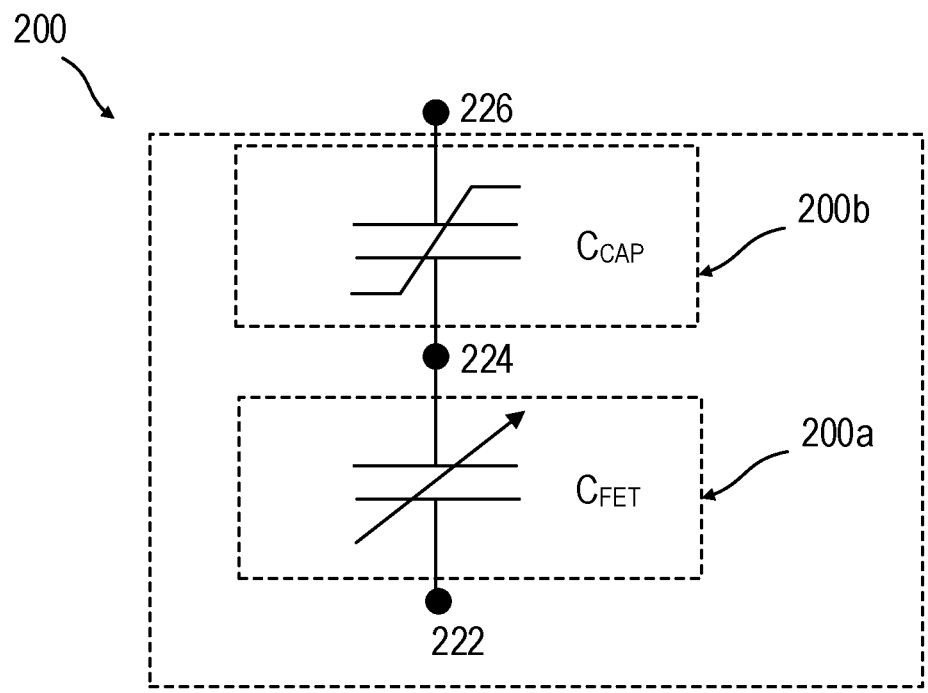
FIG. 2 shows schematically an equivalent circuit diagram of a memory cell, according to various aspects.

FIG. 2 shows a circuit equivalent of a memory cell 200 including a field-effect transistor structure 200a (e.g., configured as described here with reference to the field-effect transistor structure 100) and a capacitive memory structure 200b, according to various aspects. The field-effect transistor (FET) structure 200a may have a first capacitance, $C_{FET}$, associated therewith and the capacitive memory structure 200b may have a second capacitance, $C_{CAP}$, associated therewith. The field-effect transistor structure 200a and the capacitive memory structure 200b may be coupled (e.g., electrically connected) to one another such that a capacitive voltage divider is provided. The channel or bulk node of the field-effect transistor structure 200a may provide or may be connected to a first node 222, an electrode of the capacitive memory structure 200b may provide or may be connected to a second node 226, and an intermediate conductive portion (electrode, layer, etc.) may provide or may be connected to a floating intermediate node 224. Exemplary realizations of such connected structures will be described in further detail below, for example in relation to FIG. 3A to FIG. 3E.

The capacitive voltage divider formed by the field-effect transistor structure 200a and the capacitive memory structure 200b may allow adapting the capacitances $C_{FET}$, $C_{CAP}$ of the respective capacitors to allow an efficient programming of the capacitive memory structure 200b. The overall gate voltage required for switching the memory cell 200 from one memory state into another memory state (e.g. from high threshold voltage state to low threshold voltage state, as described below), may become smaller in case the voltage distribution across the field-effect transistor structure 200a and the capacitive memory structure 200b is adapted such that more of the applied gate voltage drops across the memory layer of the capacitive memory structure 200b (e.g., across a remanent-polarizable layer, such as a ferroelectric layer) than across the gate isolation of the field-effect transistor structure 200a. The overall write voltage (illustratively, applied via the nodes 222, 226 to which the field-effect transistor structure 200a and the capacitive memory structure 200b are connected) may thus be reduced by adapting the capacitive voltage divider. The voltage distribution may be determined by voltage divider calculations for a series connection of the capacitors.

That is, in case the capacitance, $C_{FET}$, of the field-effect transistor structure 200a is adapted (e.g., by providing a suitable gate isolation) a predefined fraction of the voltage applied to the series connection may drop across the capacitive memory structure 200b. Accordingly, the electric field generated across the gate isolation of the field-effect transistor structure 200a underneath the capacitive memory structure 200b could be reduced if desired. This may lead to a reduced interfacial field stress, which may lead to a reduced wear out of the interface due to, for example, charge injection. Therefore, the reduced electric field generated across the gate isolation may lead to improved endurance characteristics of the memory cell 200, that is, to an increased amount of possible polarization reversals until the memory cell 200 may lose or change its memory properties.

In some aspects, the memory layer of the capacitive memory structure 200b may be a remanent-polarizable layer. By increasing the capacitance $C_{FET}$ of the field-effect transistor structure 200a (e.g., by providing a gate isolation including a relatively thick layer of material with high dielectric constant), the depolarization field, $E_{Dep}$, of the remanent-polarizable layer may be reduced. The depolarization field may be expressed by the following set of equations, wherein the indices "FET" refer to the capacitor provided by the field-effect transistor structure 200a and the indices "CAP" refer to the capacitor provided by the capacitive memory structure 200b, as described herein:

$$V_{FET} + V_{CAP} = 0,$$

$$D = \varepsilon_0 \varepsilon_{FET} E_{FET} = \varepsilon_0 \varepsilon_{CAP} E_{CAP} + P,$$

$$E_{CAP} \equiv E_{Dep} = -P\left(\varepsilon_0 \varepsilon_{CAP}\left(\frac{C_{FET}}{C_{CAP}} + 1\right)\right)^{-1}.$$

The depolarization field $E_{Dep}$ may be detrimental to data retention since, depending on its magnitude, it may depolarize the remanent-polarizable layer. However, the magnitude may be reduced by increasing the capacitance ratio $C_{FET}/C_{CAP}$. Accordingly, in case the capacitance $C_{FET}$ of the field-effect transistor structure 200a is increased, the depolarization field is reduced. This in turn improves the data retention of the memory cell 200.

In a first approximation, the voltage which drops across the memory structure capacitor, $V_{CAP}$, may be estimated by:

$$V_{CAP} = V_{226} \cdot \frac{C_{FET}}{C_{FET} + C_{CAP}},$$

wherein $V_{226}$ represents the voltage applied to the top node 226 (e.g., to a top electrode of the capacitive memory structure 200b, for example assuming that the node 222 associated with the bulk of the field-effect transistor structure 200a is connected to a base potential, e.g. to ground or 0 V) and the capacitances in general are defined as described above. Suitable parameters for influencing the voltage drop across the capacitive memory structure 200b (e.g., across the ferroelectric capacitor) may be represented by the area ratio between the capacitive memory structure 200b and the field-effect transistor structure 200a, and/or by the relative permittivity of the field-effect transistor structure 200a (e.g., of the gate isolation of the field-effect transistor structure 200a). In some aspects, adapting the capacitance $C_{FET}$ of the field-effect transistor structure 200a to adjust the gate voltage divider may allow keeping the thickness of the layer (e.g., the memory layer, e.g., a remanent-polarizable layer, e.g., a spontaneously-polarizable layer) of the capacitive memory structure 200b in a predefined range.

FIG. 3A to FIG. 3E illustrate schematically possible realizations of a respective memory cell 300a, 300b, 300c, 300d, 300e. These memory cells 300a, 300b, 300c, 300d, 300e may be configured such that a field-effect transistor structure 302a and a capacitive memory structure 302b of the respective memory cell 300a, 300b, 300c, 300d, 300e are connected to form a capacitive voltage divider $C_{FET}/C_{CAP}$, as described with reference to the memory cell 200 in FIG. 2. Each of the described memory cells 300a, 300b, 300c, 300d, 300e may include a field-effect transistor structure 302a including a channel 304 (also referred to herein as channel region 304), a gate isolation 306, and a gate electrode 308. The channel 304, the gate isolation 306, and the gate electrode 308 may be configured as described above, e.g., with reference to channel 102, the gate isolation 104, and the gate electrode 106 of the field-effect transistor structure 100. In some aspects, the gate isolation 306 may include a first gate isolation layer 306a and a second gate isolation layer 306b. In other aspects, the gate isolation 306 may include a single gate isolation layer, i.e. one of the two gate isolation layers 306a, 306b may be omitted. The gate isolation 306 may extend from the channel region 304 to the gate electrode 308.

In some aspects, the first gate isolation layer 306a may be in direct physical contact with the channel region 304. The second gate isolation layer 306b may be in direct physical contact with the first gate isolation layer 306a and with the gate electrode 308 of the field-effect transistor structure 302a.

Each of the described memory cells 300a, 300b, 300c, 300d, 300e may include a capacitive memory structure 302b electrically connected (in other words, electrically coupled) with the field-effect transistor structure 302a. The capacitive memory structure 302b may include any type of planar or non-planar design with at least a first electrode 322, a second electrode 326 and at least one memory structure 324 disposed between the first electrode 322 and the second electrode 326, e.g. to provide memory functions. The memory structure 324 may be or may include one or more memory layers, e.g., one or more remanent-polarizable layers. However, the memory structure 324 may include other implementations of memory materials or memory structures, e.g., an anti-ferroelectric layer coupled (e.g., disposed directly on) to a charge storage layer. The charge storage layer may include any material suitable to store charge (e.g., by trapping).

Figure 3A:
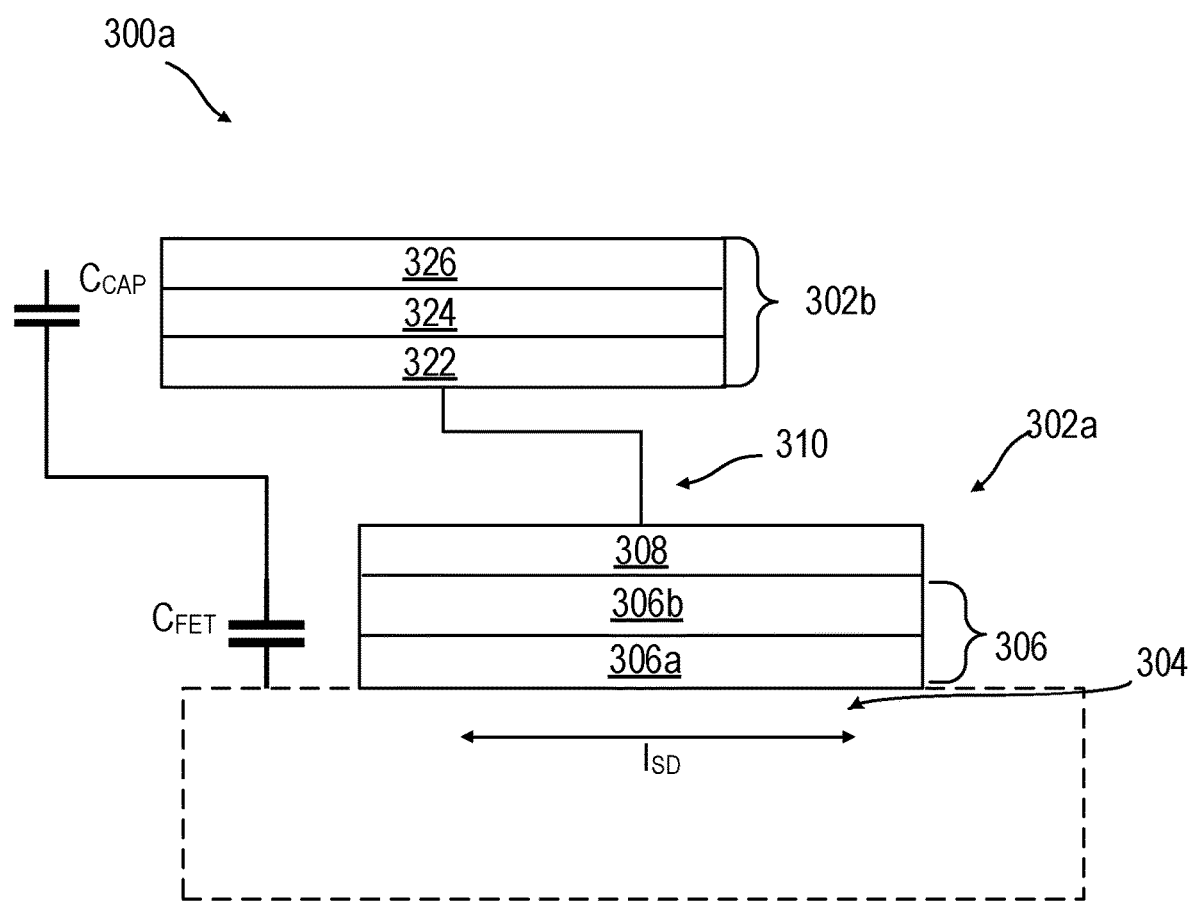
FIG. 3A to FIG. 3E each shows schematically a memory cell, according to various aspects.

As described above with reference to the memory cell 200 in FIG. 2, the field-effect transistor structure 302a and the capacitive memory structure 302b may be connected to form a capacitive voltage divider $C_{FET}/C_{CAP}$, e.g., by connecting one of the electrodes of the capacitive memory structure 302b (e.g., the first electrode 322) with the gate electrode 308 of the field-effect transistor structure 302a, as shown for example in FIG. 3A. The electrically conductive connection of the capacitive memory structure 302b with the field-effect transistor structure 302a (e.g., of the first electrode 322 with the gate electrode 308) may provide a series capacitive connection between the capacitors formed by the capacitive memory structure 302b and the field-effect transistor structure 302a. In a planar configuration, the first electrode 322 of the capacitive memory structure 302b may be a first capacitor electrode, the second electrode 326 may be a second capacitor electrode, and the at least one memory structure 324 may be a dielectric medium between the first electrode and the second capacitor electrode.

In some aspects, the gate electrode 308 of the field-effect transistor structure 302a may be electrically conductively connected to the first electrode 322 of the capacitive memory structure 302b via an electrically conductive (e.g., ohmic) connection 310, as shown in FIG. 3A. In some aspects, the first electrode 322 of the capacitive memory structure 302b may be in direct physical contact with the gate electrode 308 of the field-effect transistor structure 302a.

Figure 3B:
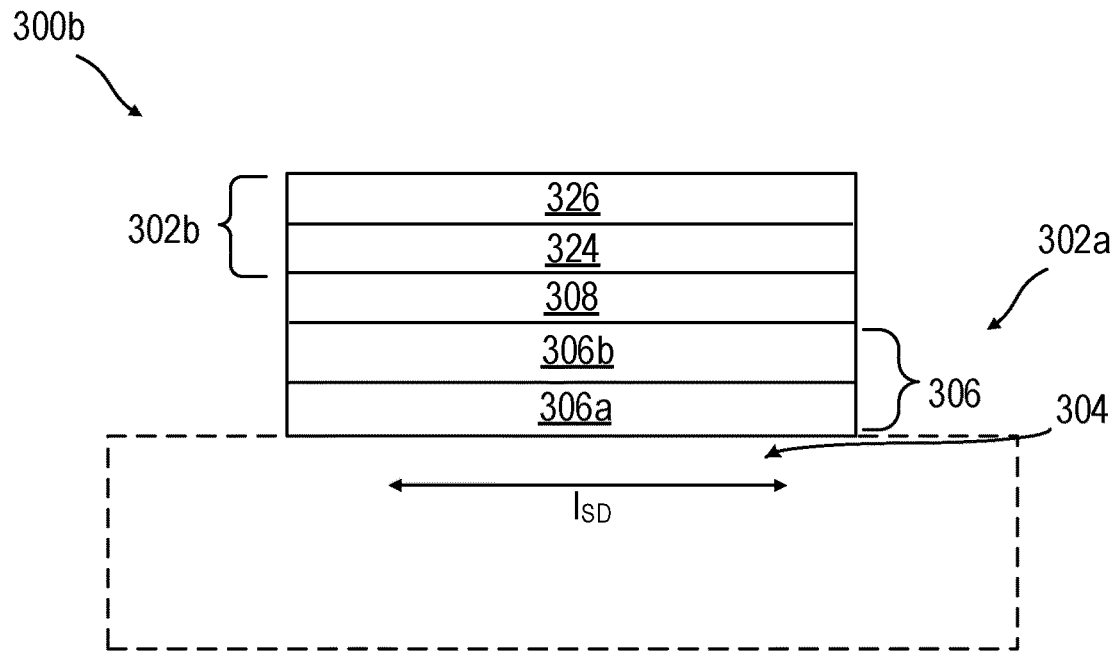

In some aspects, the capacitive memory structure 302b and the field-effect transistor structure 302a may share a common electrode acting as gate electrode of the field-effect transistor structure 302a and as electrode of the capacitive memory structure 302b, as shown in FIG. 3B.

Figure 3C:
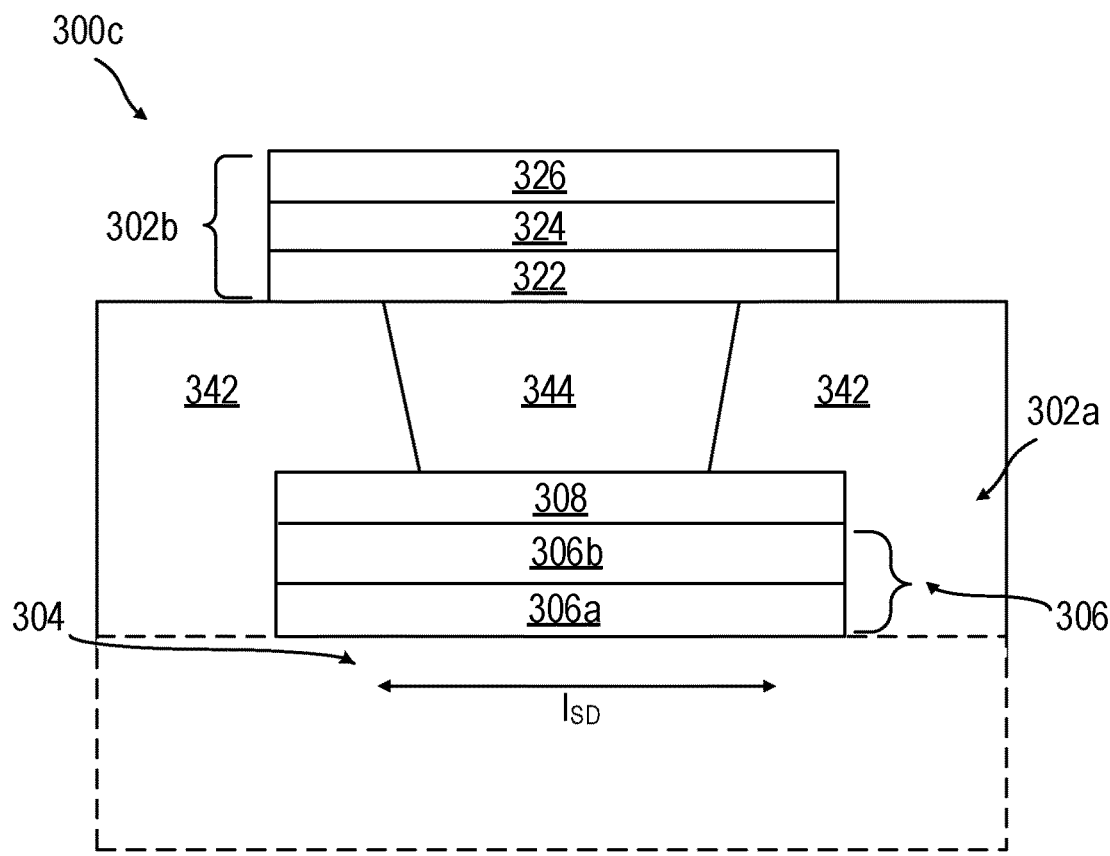

In some aspects, the electrically conductive (e.g., ohmic) connection 310 between the field-effect transistor structure 302a and the capacitive memory structure 302b may be provided by one or more metallization structures disposed over the field-effect transistor structure 302a, as shown in FIG. 3C.

The at least one memory structure 324 may include any type of remanent-polarizable and/or spontaneously-polarizable material, e.g., a ferroelectric material, an anti-ferroelectric material, an anti-ferroelectric-like material, etc. The at least one memory structure 324 may be the memory layer of the capacitive memory structure 302b to store, for example, an information via at least two remanent polarization states of the at least one memory structure 324. The programming of the capacitive memory structure 302b (illustratively the storage of information therein) may be carried out by providing an electric field between the first electrode 322 and the second electrode 326 (e.g., an electric potential difference between a first node and a second node associated with the first electrode 322 and the second electrode 326, respectively, as described in relation to FIG. 2) to thereby set or change the remanent polarization state of the at least one memory structure 324. As an example, a voltage may be provided between the top electrode 326 and the bulk region of the field-effect transistor structure 302a.

It may be understood that a memory structure 324 is only an example of a possible memory layer of the capacitive memory structure 302b, and any other memory layer whose state may be altered by an electric field provided across the capacitive memory structure 302b may be used. In some aspects, a material of the memory structure 324 may include hafnium and/or zirconium.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

According to various aspects, a ferroelectric material may be used as part of a capacitive memory structure of a memory cell (e.g., as part of the capacitive memory structure 302b of a memory cell 300a, 300b, 300c, 300d, 300e, or of the capacitive memory structure 200b of the memory cell 200). A ferroelectric material may be an example of material of a remanent-polarizable layer (e.g., of the memory structure 324). Illustratively, ferroelectric materials may be used to store data in non-volatile manner in integrated circuits. The term "ferroelectric" may be used herein, for example, to describe a material that shows a hysteretic charge voltage relationship (Q-V). The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example.

According to various aspects, a memory cell (e.g., a memory cell 200, 300a, 300b, 300c, 300d, 300e), may have at least two distinct states associated therewith, for example with two distinct electrical conductivities or two distinct amounts of stored charge that may be determined to determine in which of the at least two distinct states the memory cell is residing in. According to various aspects, a memory state the memory cell is residing may be a "programmed state" or an "erased state". As an example, the programmed state may be an electrically conducting state or a state with positive stored charge (e.g., associated with a logic "1") and the erased state may be an electrically non-conducting state or a state with negative stored charge (e.g., associated with a logic "0"). However, the definition of programmed state and erased state may be selected arbitrarily.

According to various aspects, the residual polarization of the remanent-polarizable layer may define the memory state a memory cell is residing in. The polarization state of the remanent-polarizable layer may be switched by means of the capacitive memory structure. The polarization state of the remanent-polarizable layer may also be read out by means of the capacitive memory structure. According to various aspects, a memory cell may reside in a first memory state in the case that the remanent-polarizable layer is in a first polarization state, and the memory cell may reside in a second memory state in the case that the remanent-polarizable layer is in a second polarization state (e.g., opposite to the first polarization state). As an example, the polarization state of the remanent-polarizable layer may determine the amount of charge stored in the capacitive memory structure. The amount of charge stored in the capacitive memory structure may be used to define a memory state of the memory cell. The threshold voltage of a field-effect transistor structure (e.g., the field-effect transistor structure 200a, the field-effect transistor structure 302a) may be a function of the amount and/or polarity of charge stored in the capacitive memory structure, e.g. on the polarization state of the remanent-polarizable layer. A first threshold voltage, e.g. a high threshold voltage $V_{H-th}$, may be associated with the first polarization state (e.g., with the first amount and/or polarity of stored charge), and a second threshold voltage, e.g. a low threshold voltage $V_{L-th}$, may be associated with the second polarization state (e.g., with the second amount and/or polarity of stored charge). Illustratively, the first memory state may be associated with the first threshold voltage, and the second memory state may be associated with the second threshold voltage.

According to various aspects, the second gate isolation layer 306b of the gate isolation 306 of the field-effect transistor structure 302a may be a layer different from a memory layer of the capacitive memory structure 302b (e.g., different from the memory structure 324), e.g. different in at least one of the type of material(s) or the remanent-polarizable properties of the material(s). By way of example, the material of the second gate isolation layer 306b may not possess remanent-polarizable properties, e.g. it may not possess ferroelectric properties.

According to various aspects, the semiconductor portion (illustratively, where the channel region 304 may be formed), may be made of or may include silicon. However, other semiconductor materials of various types may be used in a similar way, e.g. germanium, Group III to V (e.g. SiC), or other types, including for example carbon nanotubes, organic materials (e.g., organic polymers), etc. In various aspects, the semiconductor portion may be a wafer made of silicon (e.g. p-type doped or n-type doped). In other aspects, the semiconductor portion may be a silicon on insulator (SOI) wafer. In other aspects, the semiconductor portion may be provided by a semiconductor structure, e.g., by one or more semiconductor fins, one or more semiconductor nanosheets, one or more semiconductor nanowires, etc., disposed at a carrier.

FIG. 3C shows an exemplary integration scheme for a memory cell 300c in a schematic view, according to various aspects, in which a metallization structure is provided to electrically connect the field-effect transistor structure 302a to the capacitive memory structure 302b. It may be understood that the metallization structure may include a plurality of metallization structures, e.g. a plurality of single- or multi-level contact structures.

The metallization structure may be configured to electrically conductively connect the gate electrode 308 of the field-effect transistor structure 302a and the first electrode 322 of the capacitive memory structure 302b with one another. As an example, the metallization structure may include a contact metallization. The contact metallization may be at least partially disposed between the field-effect transistor structure 302a and the capacitive memory structure 302b. As another example, the metallization structure may include a contact metallization and a single- or multi-level metallization disposed over the contact metallization. In this case, both the contact metallization and at least one level of the single- or multi-level metallization may be disposed between the field-effect transistor structure 302a and the capacitive memory structure 302b.

The metallization structure may include a gate contact structure 344 (also referred to as gate contact). The gate contact structure 344 may be embedded in (e.g., may be laterally surrounded by) an insulator layer 342. The insulator layer 342 may include a dielectric material, e.g., silicon oxide ($SiO_2$), silicon nitride ($SiN_x$), etc., having, for example, a thickness in the range from about 10 nm to about 100 nm, e.g., a thickness of 40 nm. In some aspects, the insulator layer 342 may include a plurality of insulator layers, e.g. each including a same material or different materials. The gate contact structure 344 may include at least one metal layer, e.g., including tungsten (W), cobalt (Co), etc. The gate contact structure 344 may be in direct physical contact with the gate electrode 308 of the field-effect transistor structure 302a. The gate contact structure 344 may be in direct physical contact with the first electrode 322 of the capacitive memory structure 302b. According to various aspects, the electrical connection between the first electrode 322 of the capacitive memory structure 302b and the gate electrode 308 of the field-effect transistor structure 302a may be formed by the gate contact structure 344.

A further metallization structure (shown, for example, in FIG. 3D and FIG. 3E) may be formed over the capacitive memory structure 302b. The further metallization structure may include a memory contact structure (also referred to as memory contact). The memory contact structure may be embedded in (e.g., may be laterally surrounded by) a further (e.g., second) insulator layer.

Figure 3D:
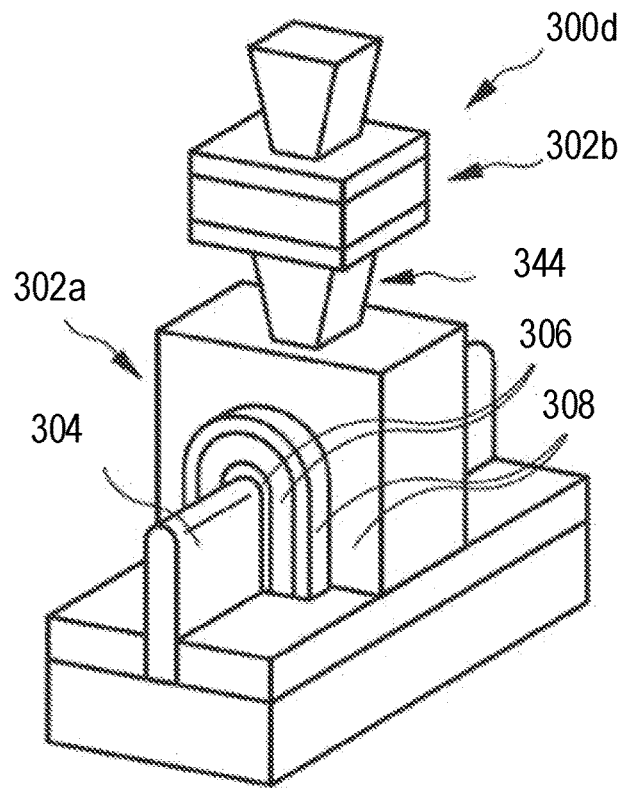
Figure 3E:
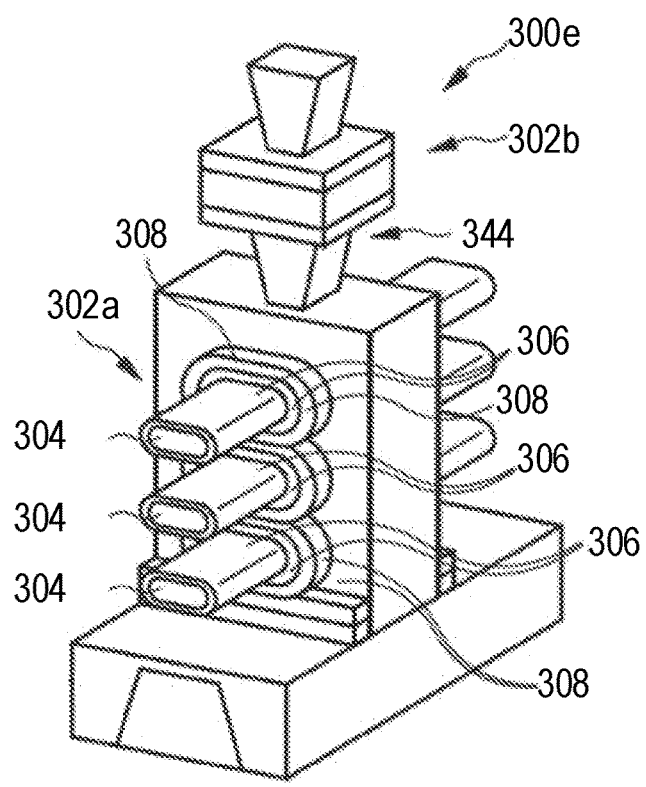

FIG. 3D and FIG. 3E illustrate possible non-planar structures for a memory cell 300d, 300e, e.g. for a field-effect transistor structure 302a (e.g., for a memory transistor described above).

In the integration scheme shown in FIG. 3D, at least the field-effect transistor structure 302a of the memory cell 300d may be configured as a fin field-effect transistor (FinFET). The semiconductor portion in which the channel region 304 is provided may have the shape of a vertical fin, wherein the gate isolation 306 and the gate electrode 308 may at least partially surround the fin.

In the integration scheme shown in FIG. 3E, at least the field-effect transistor structure 302a of the memory cell 300e may be configured as a nanosheet or nanowire field-effect transistor. The one or more semiconductor portions, in which a channel region 304 is provided, may each have the shape of a nanosheet or nanowire. The gate isolation 306 and the gate electrode 308 may at least partially surround the respective nanosheets or nanowires.

For ferroelectric $HfO_2$, its ferroelectric properties may likely disappear when the layer thickness is reduced to below 2 nm or at least when the reduction in film thickness leads to an unacceptable increase of the crystallization temperature such that the ferroelectric phase in $HfO_2$ cannot be stabilized anymore. Therefore, according to various aspects, a layer thickness for a ferroelectric $HfO_2$ layer used in a capacitive memory structure may be selected greater than or equal to 2 nm. For the most advanced transistor platforms, e.g., illustrated exemplarily in FIG. 3D and FIG. 3E, it may be beneficial to arrange the ferroelectric $HfO_2$ layer above the field-effect transistor structure, so that the ferroelectric $HfO_2$ layer can be implemented with the desired layer thickness in these process platforms.

Various aspects of the present disclosure may be based on the realization that a precise control over the amount and the distribution of oxygen vacancies within a memory layer (illustratively, within a memory structure, such as the memory structure 324) may provide improved memory properties of a memory cell, for example a greater voltage difference between memory states (e.g., between a state associated with a logic "0" and a state associated with a logic "1"). Various aspects may be related to adapting a method of forming a memory cell to control a concentration and/or a location of oxygen vacancies in a memory layer (for example, in a remanent-polarizable layer, such as a ferroelectric layer). Various aspects may be related to a method of forming a memory cell that may be more time- and/or resource-consuming of a usual method, but which may provide a memory cell with superior properties. Illustratively, various aspects may be related to a memory layer and/or to a memory electrode that may be more expensive and/or more difficult to fabricate and may thus be not employed in a usual memory cell or in a usual memory capacitor, but that may provide improved memory properties, as described in further detail below. In various aspects, a desired oxygen vacancy profile may be provided in a memory layer, which may provide tailoring the properties of the memory layer, e.g. may provide a memory layer with improved polarization properties (e.g., with a stronger ferroelectric behavior), as an example.

Figure 4A:
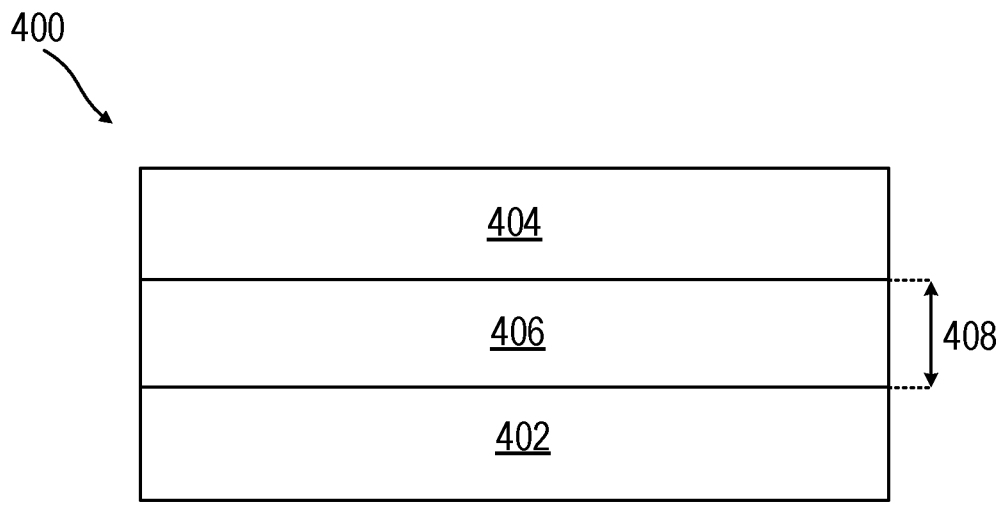
FIG. 4A shows schematically a memory cell, according to various aspects.

FIG. 4A illustrates a memory cell 400 in a schematic view according to various aspects. The memory cell 400 may be configured as the memory cell 200, 300a, 300b, 300c, 300d, 300e described in relation to FIG. 2 to FIG. 3E, but may include at least one of an adapted memory layer and/or an adapted electrode, as described in further detail below. Illustratively, the memory cell 400 may be an adapted memory cell, in which a desired oxygen vacancy profile is provided (see for example FIG. 4B to FIG. 4D).

The memory cell 400 may include a first electrode 402 (a bottom electrode), a second electrode 404 (a top electrode), and a memory layer 406 disposed between the first electrode 402 and the second electrode 404 (as described, for example, for the first electrode 322, the second electrode 326, and the memory structure 324). In some aspects, the first electrode 402, the second electrode 404, and the memory layer 406 may form a capacitive memory structure. The first electrode 402, the second electrode 404, and the memory layer 406 may be disposed with respect to one another in such a way that data (e.g., a logic "0" or a logic "1") may be stored in the capacitive memory structure, that data may be written by acting on a state of the memory layer 406 via the first electrode 402 and the second electrode 404, and that data may be read out via the first electrode 402 and the second electrode 404 in accordance with the state of the memory layer 406. The memory layer 406 may also be referred to herein as memory structure 406.

In various aspects, the memory cell 400 may include a field-effect transistor structure (not shown), e.g. as described above for the memory cell 200, 300a, 300b, 300c, 300d, 300e shown in FIG. 2 to FIG. 3E. In other aspects, the first electrode 402, the second electrode 404, and the memory layer 406 may be integrated in a field-effect transistor structure.

In various aspects, the memory cell 400 may be adapted to provide a desired oxygen vacancy profile in the memory layer 406, e.g. along a thickness 408 of the memory layer. In some aspects, the memory cell 400 may include an adapted memory layer 406 and/or at least one adapted electrode 402, 404 (or both adapted electrodes) to induce a desired oxygen vacancy profile in the memory layer 406. The oxygen vacancy profile may be tailored to provide desired memory properties of the memory cell 400, e.g. desired electrical or polarization properties (e.g., ferroelectric properties) of the memory layer 406. Controlling the concentration and the location of oxygen vacancies in the memory layer 406 may provide, for example, stronger remanent-polarization properties of the memory layer 406, which may provide a faster writing and readout. A desired distribution of oxygen vacancies may provide, as another example, more stable polarization properties of the memory layer 406, which may provide a more stable data retention.

An oxygen vacancy profile (also referred to herein as oxygen vacancies profile) may be understood as a representation of the concentration of oxygen vacancies along one dimension, for example along the thickness of a layer. An oxygen vacancy profile in a layer may be understood as a variation of a concentration of oxygen vacancies along a thickness of the layer (e.g., along the thickness 408 of the memory layer 406, or along the thickness of the memory layer 506 described below). An oxygen vacancy profile may be understood as a spatial distribution of an average concentration of oxygen vacancies along one dimension, e.g. along the thickness of the layer (an oxygen vacancy profile may also be referred to herein as distribution of oxygen vacancies or oxygen vacancy distribution). Illustratively, the layer may be divided into a plurality of slices (or sub-layers) along its thickness, and the concentration of oxygen vacancies in each slice may provide a respective value or point of the oxygen vacancy profile. A slice may be understood as a portion of the layer having a same surface area as the layer but only a fraction of the thickness of the layer (e.g., 5% of the thickness, 1% of the thickness, or 0.1% of the thickness, as examples). An oxygen vacancy profile may thus be provided by the concentration and the location of the oxygen vacancies in the layer. A concentration of oxygen vacancies may be understood as a number of oxygen vacancies in a volume, for example a concentration of oxygen vacancies of a layer (or of a slice) may be described as a number of oxygen vacancies per cubic centimeter of the layer (or of the slice of the layer). It may be assumed, in some aspects, that the oxygen vacancies are uniformly distributed within one slice (within one sub-layer). In some aspects, a memory layer (e.g., the memory layer 406, or the memory layer 506 described below) may have a thickness in the range from about 2 nm to about 50 nm, for example from about 5 nm to about 30 nm, for example from about 10 nm to about 20 nm. A slice may have a thickness in the range from about 0.1 nm to about 5 nm, for example from about 0.5 nm to about 2 nm.

Figure 4B:
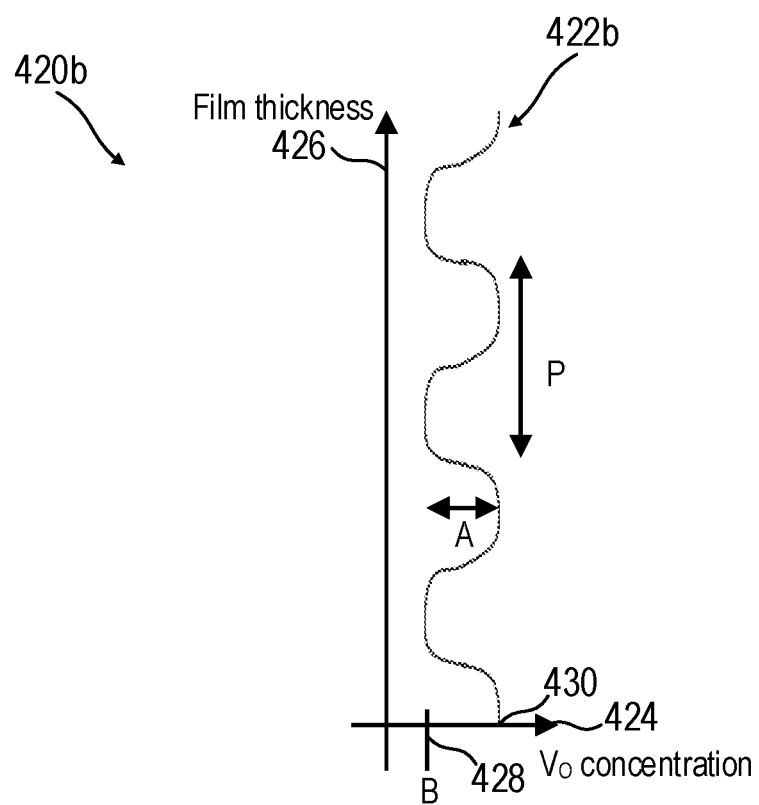
FIG. 4B to FIG. 4D each shows a graph associated with an oxygen vacancy profile, according to various aspects.
Figure 4C:
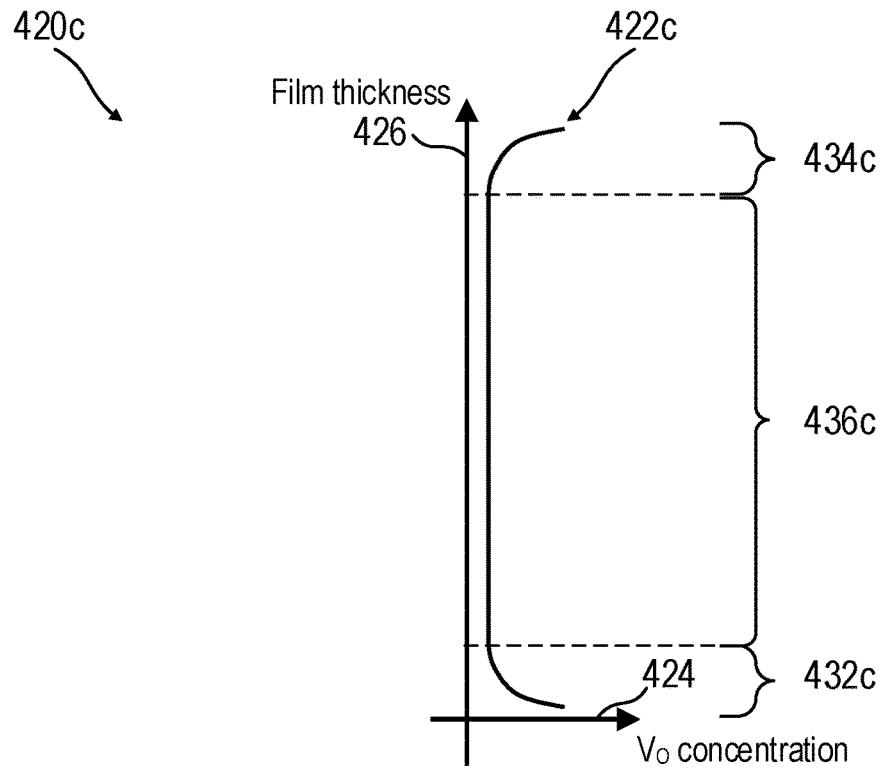
Figure 4D:
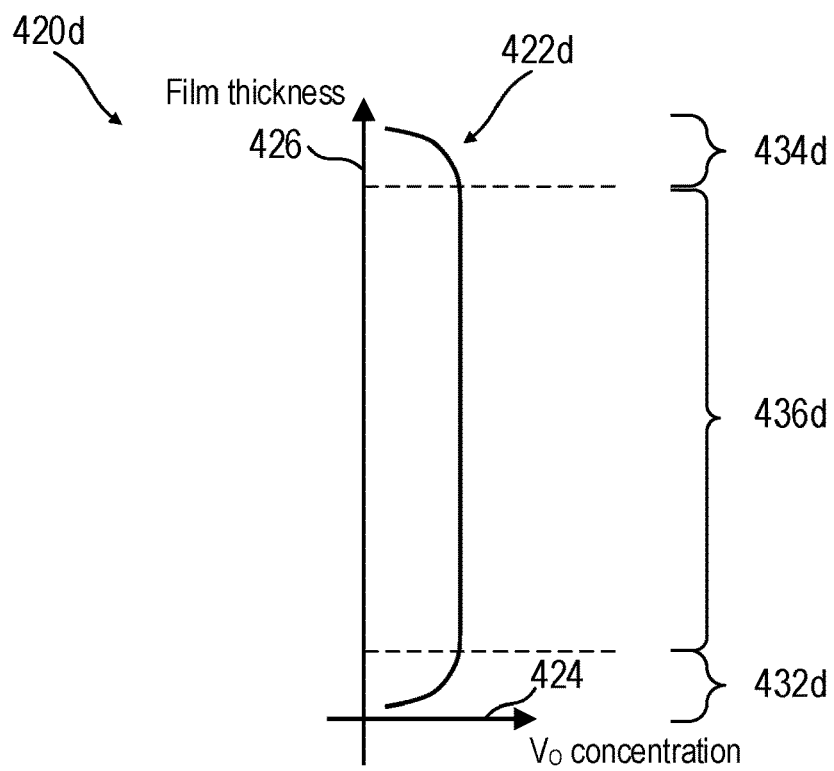

FIG. 4B, FIG. 4C, and FIG. 4D each shows a respective graph 420b, 420c, 420d illustrating a respective oxygen vacancy profile 422b, 422c, 422d that may be provided in a memory layer (e.g., in the memory layer 406). It is understood that the oxygen vacancy profiles 422b, 422c, 422d shown in FIG. 4B, FIG. 4C, and FIG. 4D serve only as examples, and the oxygen vacancy profile of a memory layer may be tailored in different ways to adapt the properties of a memory cell (e.g., of the memory cell 400) in a desired manner. In the graphs 420b, 420c, 420d the horizontal axis 424 (the x-axis) may be associated with the concentration of oxygen vacancies (Vo concentration in vacancies/cm$^3$), and the vertical 426 (the y-axis) axis may be associated with the film thickness in nanometers (illustratively, with the thickness of a memory layer, e.g. with the thickness 408 of the memory layer 406).

In a usual fabrication process, a concentration of oxygen vacancies in a layer may be not spatially controlled. A layer may have either a low or a high concentration of oxygen vacancies, depending on the processing method, and the oxygen vacancies may be uniformly (and randomly) distributed in the layer. Such a uniform distribution may be usually considered acceptable or even beneficial, as it results from the usual fabrication processes. Aspects of the present disclosure may be based on the realization that a uniform (and random) distribution of oxygen vacancies in a memory layer may not provide optimized properties of the memory layer, and thus various aspects may be based on spatially controlling the location and the concentration of oxygen vacancies to provide desired properties of the memory layer.

In some aspects, as illustrated in the graph 420b in FIG. 4B, a memory layer may include a material having a distribution of oxygen vacancies 422b that varies in a periodic manner, e.g. in a sinusoidal manner, along the layer thickness. The concentration of oxygen vacancies may vary between a first value 428 (e.g., a base value, B) and a second value 430 (a maximum value) in a periodic manner along the layer thickness. A difference between the first value 428 and the second value 430 may define an amplitude A of the oxygen vacancies profile 422b.

As a numerical example, the first value 428 may be in the range from about $10^{15}$ vacancies/cm$^3$ to $10^{17}$ vacancies/cm$^3$, or in the range from about $10^{18}$ vacancies/cm$^3$ to about $10^{22}$ vacancies/cm$^3$, and the second value 430 may be in the range from about $10^{18}$ vacancies/cm$^3$ to $10^{20}$ vacancies/cm$^3$, or in the range from about $10^{19}$ vacancies/cm$^3$ to about $10^{22}$ vacancies/cm$^3$, or greater than $10^{22}$ vacancies/cm$^3$. An amplitude A of the oxygen vacancies profile 422b may be in the range from about $10^{18}$ vacancies/cm$^3$ to $10^{20}$ vacancies/cm$^3$, or in the range from about $10^{19}$ vacancies/cm$^3$ to about $10^{22}$ vacancies/cm$^3$.

The period P may be associated with a thickness of the memory layer, e.g. with a thickness of the various sub-layers in which different concentrations of oxygen vacancies may be provided. The period P may define the periodicity (the distance) between subsequent peaks in the oxygen vacancy profile 422b. As a numerical example, the period P may be in the range from about 0.1 nm to about 5 nm, for example in the range from about 0.2 nm to about 2 nm, for example in the range from about 0.5 nm to 1 nm.

In some aspects, the amplitude A and/or the period P may remain constant over the thickness of the memory layer. In other aspects, the amplitude A and/or the period P may vary over the thickness of the memory layer. As an example, the amplitude A may have a first value in a first portion (or region) of the memory layer (e.g., in one or more memory portions, described below) and may have a second value in a second portion of the memory layer (e.g., in one or more other memory portions). As another example, additionally or alternatively, the period P may have a first value in a first portion (or region) of the memory layer (e.g., in one or more memory portions) and may have a second value in a second portion of the memory layer (e.g., in one or more other memory portions).

In some aspects, as illustrated in the graphs 420c, 420d in FIG. 4C and FIG. 4D, a memory layer may include a material having a concentration of oxygen vacancies having different values in the edge regions of the memory layer with respect to a central region (illustratively, a bulk region) of the memory layer. The material of the memory layer may have a concentration of oxygen vacancies having a first value 432c, 432d in a first edge region of the memory layer (illustratively, at a first interface between the memory layer and a first electrode), a second value 434c, 434d in a second edge region of the memory layer (illustratively, at a first interface between the memory layer and a first electrode), and a third value 436c, 436d in a central region (illustratively, in a bulk region) of the memory layer. The oxygen vacancies profile may have a concave shape (see FIG. 4C) or a convex shape (see FIG. 4D) along the thickness of the memory layer.

An edge region of a layer (e.g., of the memory layer) may be understood, in some aspects, as a region extending from a main surface of the layer towards the inner portion of the layer for a relatively small thickness, e.g. a thickness of an edge region may be less than 5 nm, for example less than 2 nm, for example less than 1 nm.

The first value 432c, 432d in the first edge region may be understood, in some aspects, as a first average value of the concentration of oxygen vacancies in the first edge region, for example varying from a maximum first value to a minimum first value (see FIG. 4C), or varying from a minimum first value to a maximum first value (see FIG. 4D) over a thickness of the first edge region. Illustratively, the concentration of oxygen vacancies in the first edge region may gradually decrease or gradually increase until it reaches the value of the concentration of oxygen vacancies in the central region of the memory layer. It is understood that also an abrupt variation in the concentration of oxygen vacancies may be possible, e.g. the first value 432c, 432d may remain substantially constant over the thickness of the first edge region, and the concentration of oxygen vacancies may abruptly decrease or abruptly increase to the value of the concentration of oxygen vacancies in the central region of the memory layer.

The second value 434c, 434d in the second edge region may be understood, in some aspects, as a second average value of the concentration of oxygen vacancies in the second edge region, for example varying from a maximum second value to a minimum second value (see FIG. 4C), or varying from a minimum second value to a maximum second value (see FIG. 4D) over a thickness of the second edge region. Illustratively, the concentration of oxygen vacancies in the second edge region may gradually decrease or gradually increase until it reaches the value of the concentration of oxygen vacancies in the central region of the memory layer. It is understood that also an abrupt variation in the concentration of oxygen vacancies may be possible, e.g. the second value 434c, 434d may remain substantially constant over the thickness of the second edge region, and the concentration of oxygen vacancies may abruptly decrease or abruptly increase to the value of the concentration of oxygen vacancies in the central region of the memory layer.

The third value 436c, 436d in the central region may be understood, in some aspects, as a third average value of the concentration of oxygen vacancies in the central region. The third value of the concentration of oxygen vacancies may be substantially constant over the thickness of the central region, for example varying within ±5% of the third average value from the third average value, or within ±2% of the third average value from the third average value.

In some aspects, the first value 432c, 432d may be substantially equal to the second value 434c, 434d (as illustrated in FIG. 4C and FIG. 4D). The concentration of oxygen vacancies in the first edge region and in the second edge region may have a same value and may vary in a same manner in the respective edge region (e.g., may increase or decrease with a same slope in the first edge region and in the second edge region). In other aspects, the first value 432c, 432d may be different from the second value 434c, 434d, e.g. the first value 432c, 432d may be greater than the second value 434c, 434d or may be less than the second value 434c, 434d. The concentration of oxygen vacancies in the first edge region and in the second edge region may have different values and may vary in a same manner or in a different manner in the respective edge region. As an example, the first value may decrease from a first maximum value to a minimum maximum value, whereas the second value may increase from a second minimum value to a second maximum value. (or vice versa). As another example, the first value and the second value may decrease from a respective first maximum value and second maximum value (different from one another) to a respective first minimum value and second minimum value (which may be equal to one another, e.g. equal to the third value). As a further example, the first value and the second value may increase from a respective first minimum value and second minimum value (different from one another) to a respective first maximum value and second maximum value (which may be equal to one another, e.g. equal to the third value).

In some aspects, as shown in the oxygen vacancy profile 422c in FIG. 4C, the first value 432c and the second value 434c in the first and second edge regions of the memory layer may be greater (e.g., one order of magnitude greater, three orders of magnitude greater, or five orders of magnitude greater) than the third value 436c in the central region of the memory. Only as a numerical example, the first value 432c and the second value 434c may be in the range from about $10^{18}$ vacancies/cm$^3$ to $10^{20}$ vacancies/cm$^3$, or in the range from about $10^{19}$ vacancies/cm$^3$ to about $10^{22}$ vacancies/cm$^3$, or greater than $10^{22}$ vacancies/cm$^3$, and the third value 436c may be in the range from about $10^{15}$ vacancies/cm$^3$ to $10^{17}$ vacancies/cm$^3$, or in the range from about $10^{18}$ vacancies/cm$^3$ to about $10^{22}$ vacancies/cm$^3$.

In some aspects, as shown in the oxygen vacancy profile 422d in FIG. 4D, the first value 432d and the second value 434d in the first and second edge regions of the memory layer may be less (e.g., one order of magnitude less, three orders of magnitude less, or five orders of magnitude less) than the third value 436d in the central region of the memory. Only as a numerical example, the third value 436d may be in the range from about $10^{18}$ vacancies/cm$^3$ to $10^{20}$ vacancies/cm$^3$, or in the range from about $10^{19}$ vacancies/cm$^3$ to about $10^{22}$ vacancies/cm$^3$, or greater than $10^{22}$ vacancies/cm$^3$, and the first value 432d and the second value 434d may be in the range from about $10^{15}$ vacancies/cm$^3$ to $10^{17}$ vacancies/cm$^3$, or in the range from about $10^{18}$ vacancies/cm$^3$ to about $10^{22}$ vacancies/cm$^3$.

The values of the concentration of oxygen vacancies and the spatial profile along the thickness of the memory layer may be selected according to the desired properties to be provided for the memory layer, e.g. according to the desired electrical or polarization properties of the memory layer.

Various possible configurations of an adapted memory cell (e.g., of an capacitive memory structure) are described in further detail below, for example with reference to FIG. 5A to FIG. 5D. Corresponding methods of forming an adapted memory cell will be described in further detail below, for example in relation to FIG. 6 and FIG. 7.

FIG. 5A, FIG. 5B, FIG. 5C, and FIG. 5D show a respective memory cell 500a, 500b, 500c, 500d in a schematic view according to various aspects. These memory cells 500a, 500b, 500c, 500d may be exemplary realizations of an adapted memory cell 400, e.g. of an adapted memory cell with a controlled distribution of oxygen vacancies in the memory layer.

It is understood that the representations of the memory cells 500a, 500b, 500c, 500d is only for illustration purposes, and are not to be interpreted to provide a quantitative representation of the memory cells 500a, 500b, 500c, 500d. The illustrations of the memory cells 500a, 500b, 500c, 500d are not to be interpreted to provide a quantitative representation of the location of an atom, of a ratio between atoms of different sort, of an abundance of an atom in a layer, of a size or relative size of an atom, and the like. In the following, in case an atom is mentioned or described, for example in relation to a crystal structure or lattice, it is understood that the atom may be a charged atom, depending on the type of structure or lattice.

It is also understood that the memory cells 500a, 500b, 500c, 500d shown in FIG. 5A to FIG. 5D are exemplary configurations, and other configurations may be possible, for example with a different oxygen vacancy profile in the memory layer, with different number of layers or portions, and the like.

A memory cell 500a, 500b, 500c, 500d may include a first electrode 502, a second electrode 504, and a memory layer 506 disposed between the first electrode 502 and the second electrode 504 (e.g., as described above for the first electrode 402, the second electrode 404, and the memory layer 406 disposed therebetween). At least one of the first electrode 502, the second electrode 504, and/or the memory layer 506 may be adapted to provide a desired oxygen vacancy profile in the memory layer 506, as described in further detail below.

In some aspects, the first electrode 502, the second electrode 504, and the memory layer 506 may form a capacitive memory structure (e.g., to be coupled to a field-effect transistor structure). The memory layer 506 may be in direct physical contact with the first electrode 502 and with the second electrode 504. Illustratively, a first (shared) interface region may be present between the memory layer 506 and the first electrode 502, and a second (shared) interface region may be present between the memory structure 506 and the second electrode 504.

The memory cell 500a, 500b, 500c, 500d may include a field-effect transistor structure (e.g., configured as the field-effect transistor structure 100, 200a, 302a described in relation to FIG. 1 to FIG. 3E), and the field-effect transistor structure may be coupled with the capacitive memory structure. The field-effect transistor structure and the capacitive memory structure may be coupled to one another to form a capacitive voltage divider (see, for example, FIG. 2). The field-effect transistor structure may include a gate structure (e.g., as described for the gate structure of the field-effect transistor structure 100, 302a) coupled to the capacitive memory structure. The gate structure may include a gate electrode and a gate isolation separating the gate electrode from a channel region of the field-effect transistor structure (as described in relation to the channel region 102, 304, the gate electrode 106, 308, and the gate isolation 104, 306 in FIG. 1 to FIG. 3E). The gate electrode and the first electrode 502 of the capacitive memory structure may be coupled with one another.

In other aspects, the first electrode 502, the second electrode 504, and the memory layer 506 may be part of a field-effect transistor structure (e.g., the capacitive memory structure may be integrated in a field-effect transistor structure). A ferroelectric field-effect transistor (FeFET) structure may be provided, in which the state of the memory layer 506 influences a threshold voltage of the field-effect transistor structure (e.g., a first state of the memory layer 506 may be associated with a first threshold voltage, such as a low threshold voltage, and a second state of the memory layer 506 may be associated with a second threshold voltage, such as a high threshold voltage). Illustratively, in some aspects, the first electrode 502 may be understood as a semiconductor substrate or portion (e.g., as a channel region) of a field-effect transistor structure, for example including one or more buffer layers (e.g., one or more buffer insulator films), and the second electrode 504 may be understood as an electrode (e.g., a gate electrode) of the field-effect transistor structure. Illustratively, in some aspects, the memory layer 506 may be a layer of a gate isolation of a field-effect transistor structure, cf. FIG. 1. In other words, a field-effect transistor structure may include a channel, and a gate stack disposed adjacent to the channel, wherein the gate stack includes a memory layer as gate isolation disposed between the channel and a gate electrode. The channel and the gate electrode provide the capacitive function of such a memory cell. In other aspects, the gate stack may include a gate isolation (e.g., high-k and/or low-k), a memory layer (e.g., disposed over the gate isolation) and a gate electrode disposed over the memory layer. The channel and the gate electrode provide the capacitive function of such a memory cell.

Figure 5A:
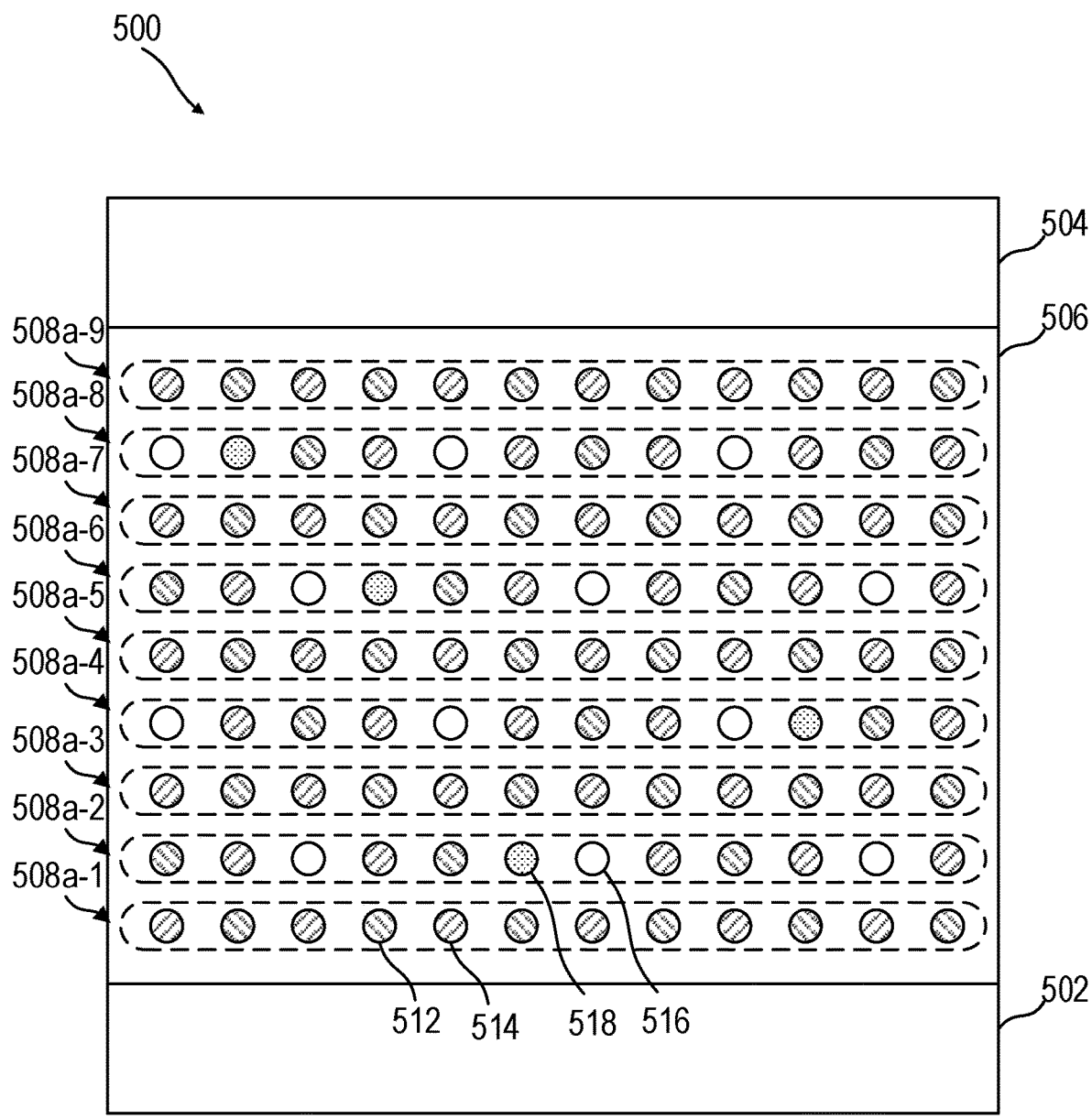
FIG. 5A to FIG. 5D each shows schematically a memory cell, according to various aspects.
Figure 5B:
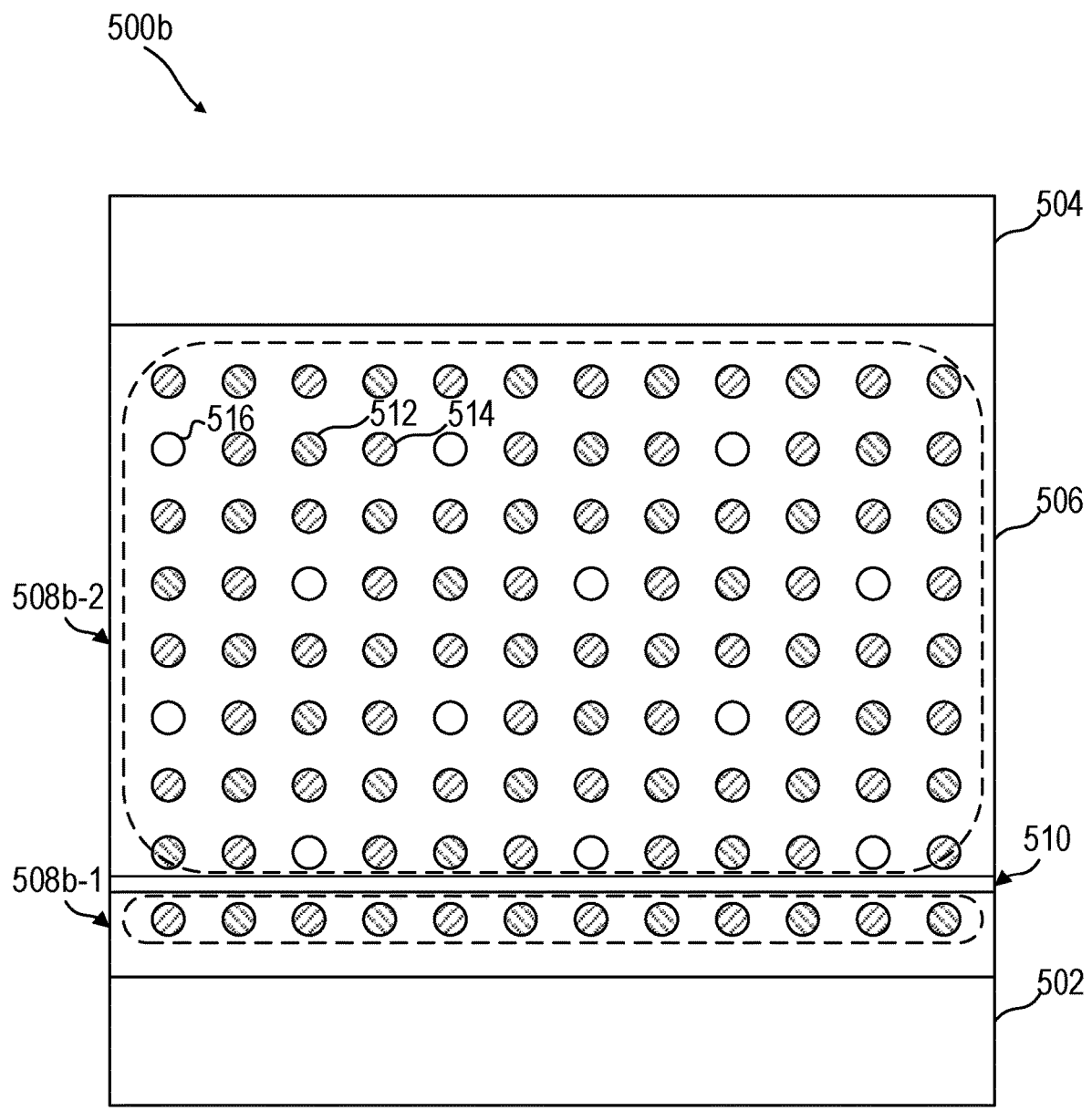

In some aspects, as shown for example in FIG. 5A and FIG. 5B, a memory layer 506 may include a plurality of memory portions 508. In the following reference may be made to a first memory portion 508-1, a second memory portion 508-2, etc., which may be generally referred to as memory portions 508. A memory portion 508 may be understood as a sub-portion or sub-layer of the memory layer 506. In some aspects, a memory portion 508 may be understood as a portion of the memory layer over which a variation in the concentration of oxygen vacancies may be appreciated. A memory portion 508 may include, as a numerical example, at least $10^5$ atoms, or at least $10^{10}$ atoms, or at least $10^{20}$ atoms. In some aspects, a memory portion may be understood as a sub-layer of the memory layer 506, e.g. as a layer having a same surface area as the memory layer 506 and a thickness less than the thickness of the memory layer 506 (for example, the thickness of a memory portion 508 may be 0.5% of the thickness of the memory layer 506, or 1% of the thickness of the memory layer 506, or 5% of the thickness of the memory layer 506). In some aspects, a width of a memory portion 508 may be greater than 5 nm, or greater than 10 nm, or greater than 20 nm, and a thickness of a memory portion 508 may be in the range from about 0.1 nm to about 5 nm, or from about 0.2 nm to about 2 nm, or from about 0.5 nm to about 1 nm. In some aspects, each memory portion 508 may have a same thickness. In other aspects, different memory portions may have different thickness from one another.

In some aspects, the memory layer 506 may be remanently polarizable or spontaneously polarizable. The memory layer 506 (e.g., each or at least some of the memory portions 508) may include a remanent-polarizable material. The memory layer 506 may allow storage of data based on polarizing (remanently) one or more layers including one or more suitable materials or a suitable combination of materials. In some aspects, the remanent-polarizable material may be based on at least one metal oxide. Illustratively, a composition of the remanent-polarizable material may include the at least one metal oxide for more than 50%, or more than 66%, or more than 75%, or more than 90%. In some aspects, the remanent-polarizable material may include one or more (first) metal oxides. The remanent-polarizable material may include (or may be based on) at least one of $Hf_aO_b$, $Zr_aO_b$, $Si_aO_b$, $Y_aO_b$, as examples, wherein the subscripts "a" and "b" may indicate the number of the respective atom in the remanent-polarizable material. The memory layer may include a remanent-polarizable material having a crystal structure in which oxygen vacancies are introduced at desired locations in the crystal lattice, as described in further detail below.

In other aspects, the memory layer 506 may include one or more charge storage layers. The memory layer 506 may allow storage of data based on charging (e.g., permanently) one or more charge storage layers including one or more suitable materials or a suitable combination of materials. In still other aspects, the memory layer 506 may include one or more charge storage layers and one or more polarizable layers, e.g., one or more spontaneously polarizable layers (e.g., one or more anti-ferroelectric layers). The memory layer 506 may allow storage of data based on charging (e.g., permanently) one or more charge storage layers assisted by the one or more polarizable layers.

In some aspects, the memory layer 506 (e.g., each or at least some of the memory portions 508) may include a ferroelectric material. The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferro-electricity in hafnium oxide or zirconium oxide.

In some aspects, as shown for example in FIG. 5A, different memory portions 508 may include a different concentration of oxygen vacancies (e.g., according to a desired oxygen vacancy profile, for example according to one of the oxygen vacancy profiles described in relation to FIG. 4B to FIG. 4D). In the exemplary configuration of the memory cell 500a in FIG. 5A, the memory layer 506 may include a first memory portion 508a-1, a second memory portion 508a-2, a third memory portion 508a-3, a fourth memory portion 508a-4, a fifth memory portion 508a-5, a sixth memory portion 508a-6, a seventh memory portion 508a-7, an eighth memory portion 508a-8, and a ninth memory portion 508a-9. It is however understood that a memory layer 506 may include any suitable number of memory portions, for example ten or more than ten, fifty or more than fifty, etc. It is also understood that the subdivision of the memory layer 506 in the memory portions 508a-1 to 508a-9 shown in FIG. 5A is only an example, and other subdivisions of the memory layer 506 in a plurality of memory portions 508 may be provided.

Each memory portion may include a respective concentration of oxygen vacancies. The first memory portion 508a-1 may include a first concentration of oxygen vacancies, the second memory portion 508a-2 may include a second concentration of oxygen vacancies, the third memory portion 508a-3 may include a third concentration of oxygen vacancies, the fourth memory portion 508a-4 may include a fourth concentration of oxygen vacancies, the fifth memory portion 508a-5 may include a fifth concentration of oxygen vacancies, the sixth memory portion 508a-6 may include a sixth concentration of oxygen vacancies, the seventh memory portion 508a-7 may include a seventh concentration of oxygen vacancies, the eighth memory portion 508a-8 may include an eighth concentration of oxygen vacancies, and the ninth memory portion 508a-9 may include a ninth concentration of oxygen vacancies.

The respective concentration of oxygen vacancies may be adapted in accordance with the desired oxygen vacancy profile. Some of the concentrations of oxygen vacancies may be different from one another, and some of the concentrations of oxygen vacancies may be equal to one another, as an example. As another example, all of the concentrations of oxygen vacancies may be different from one another. At least two of the concentrations of oxygen vacancies may be different from one another.

A memory portion 508 may include a concentration of oxygen vacancies in the range form about $10^{15}$ vacancies/$cm^3$ to $10^{17}$ vacancies/$cm^3$, or in the range from about $10^{18}$ vacancies/$cm^3$ to about $10^{22}$ vacancies/$cm^3$, or in the range from about $10^{18}$ vacancies/$cm^3$ to $10^{20}$ vacancies/$cm^3$, or in the range from about $10^{19}$ vacancies/$cm^3$ to about $10^{22}$ vacancies/$cm^3$, or greater than $10^{22}$ vacancies/$cm^3$. A difference in the concentration of oxygen vacancies of different memory portions 508 may be adapted in accordance with the desired oxygen vacancy profile. As a numerical example, a difference in the concentration of oxygen vacancies of different memory portions 508 (e.g., a different between the first concentration of oxygen vacancies and the second concentration of oxygen vacancies, as an example) may be in the range from about $10^{18}$ vacancies/$cm^3$ to $10^{20}$ vacancies/$cm^3$, or in the range from about $10^{19}$ vacancies/$cm^3$ to about $10^{22}$ vacancies/$cm^3$.

In the exemplary representation in FIG. 5A, the second concentration of oxygen vacancies may be different from the first concentration of oxygen vacancies. As an example, the second concentration of oxygen vacancies may be greater than the first concentration of oxygen vacancies (for example 10 times greater, 100 times greater, or 1000 times greater).

In some aspects, the third concentration of oxygen vacancies may be equal to one of the first concentration of oxygen vacancies or the second concentration of oxygen vacancies, for example to the first concentration of oxygen vacancies in the exemplary representation in FIG. 5A (to provide a periodically varying oxygen vacancy profile). In other aspects, the third concentration of oxygen vacancies may be different to both the first concentration of oxygen vacancies and the second concentration of oxygen vacancies (e.g., greater than both, or less than both, to provide an increasing or decreasing profile).

In some aspects, the fourth concentration of oxygen vacancies may be different from the third concentration of oxygen vacancies. The fourth concentration of oxygen vacancies may be equal to the other one of the first concentration of oxygen vacancies or the second concentration of oxygen vacancies, for example to the second concentration of oxygen vacancies in the exemplary representation in FIG. 5A (to provide a periodically varying oxygen vacancy profile). In other aspects, the fourth concentration of oxygen vacancies may be different to the first concentration of oxygen vacancies, the second concentration of oxygen vacancies, and the third concentration of oxygen vacancies (e.g., greater than all of them, or less than all of them, to provide an increasing or decreasing profile).

The same may apply to the other memory portions 508 (e.g., fifth to ninth memory portions 508a-5 to 508a-9) shown in FIG. 5A, or to any other memory portion not shown in FIG. 5A.

In some aspects, the memory layer 506 may include a material (e.g., an insulator) having a crystal structure including a host lattice. The host lattice may include atoms (e.g., charged atoms) of a first type 512 and atoms of a second type 514. At least one of the atoms of the first type 512 or of the second type 514 may include oxygen. As an example, the atoms of the first type 512 may include anions, for example $O^{2-}$, and the atoms of the second type 514 may include cations, for example $Hf^{4+}$.

Different memory portions 508 may have a material including a different lattice (e.g., respective crystal structures differing from one another in the number of oxygen vacancies in the crystal lattice). A memory portion 508 may include the atoms of the first type 512 and the atoms of the second type 514 in a respective stoichiometric relationship with one another. The first memory portion 508a-1 may include the atoms of the first type 512 and the atoms of the second type 514 in a first stoichiometric relationship with one another, the second memory portion 508a-2 may include the atoms of the first type 512 and the atoms of the second type 514 in a second stoichiometric relationship with one another, the third memory portion 508a-3 may include the atoms of the first type 512 and the atoms of the second type 514 in a third stoichiometric relationship with one another, the fourth memory portion 508a-4 may include the atoms of the first type 512 and the atoms of the second type 514 in a fourth stoichiometric relationship with one another, etc. A difference in the stoichiometric relationships in different memory portions 508 may be associated with the oxygen vacancies in the respective memory portions 508.

In the exemplary configuration shown in FIG. 5A, the first stoichiometric relationship may be different from the second stoichiometric relationship, e.g. the second memory portion 508a-2 may include the host lattice in which some of the oxygen atoms are missing and oxygen vacancies 516 are present instead. In some aspect, the second memory portion 508a-2 may be understood as a sub-stoichiometric portion in the memory layer 506 (with respect to first memory portion 508a-1) including less oxygen than another (e.g., the first) memory portion. The second memory portion 508a-2 may include a material having a second crystal structure differing from a first crystal structure of a material of the first memory portion 508a-1 in the (greater) number of oxygen vacancies in the crystal lattice.

In some aspects, the third stoichiometric relationship may be equal to one of the first stoichiometric relationship or the second stoichiometric relationship, for example to the first stoichiometric relationship in the exemplary representation in FIG. 5A (to provide a periodically varying oxygen vacancy profile). In other aspects, the third stoichiometric relationship may be different to both the first stoichiometric relationship and the second stoichiometric relationship (e.g., with more or less oxygen, to provide an increasing or decreasing profile).

In some aspects, the fourth stoichiometric relationship may be different from the third stoichiometric relationship. The fourth stoichiometric relationship may be equal to the other one of the first stoichiometric relationship or the second stoichiometric relationship, for example to the second stoichiometric relationship in the exemplary representation in FIG. 5A (to provide a periodically varying oxygen vacancy profile). In other aspects, the fourth stoichiometric relationship may be different to the first stoichiometric relationship, the second stoichiometric relationship, and the third stoichiometric relationship (e.g., with more oxygen than all of them, or less oxygen than all of them, to provide an increasing or decreasing profile).

The same may apply to the other memory portions 508 (e.g., fifth to ninth memory portions 508a-5 to 508a-9) shown in FIG. 5A, or to any other memory portion not shown in FIG. 5A.

In some aspects, each memory portion 508 may include a respective amount of oxygen, e.g. a respective number of oxygen atoms or a respective concentration of oxygen in the memory portion 508. The first memory portion 508a-1 may include a first amount of oxygen, the second memory portion 508a-2 may include a second amount of oxygen, the third memory portion 508a-3 may include a third amount of oxygen, the fourth memory portion 508a-4 may include a fourth amount of oxygen, etc.

The amount of oxygen in different memory portions 508 may be different, for example in case a memory portion 508 has a greater amount of oxygen than another memory portion 508, the amount of oxygen may be 10 times greater, 100 times greater, or 1000 times greater. In the exemplary representation in FIG. 5A, the first amount of oxygen may be different from the second concentration of oxygen vacancies. As an example, the first amount of oxygen may be greater than the second amount of oxygen (for example 10 times greater, 100 times greater, or 1000 times greater).

In some aspects, the third amount of oxygen may be equal to one of the first amount of oxygen or the second amount of oxygen, for example to the first amount of oxygen in the exemplary representation in FIG. 5A (to provide a periodically varying oxygen vacancy profile). In other aspects, the third amount of oxygen may be different to both the first amount of oxygen and the second amount of oxygen (e.g., greater than both, or less than both, to provide an increasing or decreasing profile).

In some aspects, the fourth amount of oxygen may be different from the third amount of oxygen. The fourth amount of oxygen may be equal to the other one of the first amount of oxygen or the second amount of oxygen, for example to the second amount of oxygen in the exemplary representation in FIG. 5A (to provide a periodically varying oxygen vacancy profile). In other aspects, the fourth amount of oxygen may be different to the first amount of oxygen, the second amount of oxygen, and the third amount of oxygen (e.g., greater than all of them, or less than all of them, to provide an increasing or decreasing profile).

The same may apply to the other memory portions 508 (e.g., fifth to ninth memory portions 508a-5 to 508a-9) shown in FIG. 5A, or to any other memory portion not shown in FIG. 5A.

In some aspects, the memory layer 506 may include dopant atoms 518, which may provide creating the oxygen vacancies 516 in the host lattice of the memory layer 506. A dopant atom 518 may have a coordination different from the coordination of at least one of the atoms of the first type 512 or the atoms of the second type 514, for example different from the coordination of the atoms of the second type 514 in the representation in FIG. 5A, that is different coordination with respect to the cation forming the host lattice. A dopant atom 518 may have a coordination less than the coordination of the atoms of the second type 514, such that one or more oxygen vacancies are formed (e.g., one oxygen vacancy in case a difference between the coordination of the atoms of the second type 514 and the coordination number of the dopant atoms is 1, e.g. 4-coordination and 3-coordination, two oxygen vacancies in case the difference is 2, etc.). The memory layer 506 may be doped at selected locations to provide a controlled formation of oxygen vacancies in the memory layer 506, as described in further detail below. A dopant atom 518 may be selected in accordance with the material of the memory layer 506, e.g. in accordance with the participating elements of a remanent-polarizable material of the memory layer 506. In some aspects, a dopant atom 518 may include at least one of Yttrium or Scandium. In FIG. 5A a dopant atom 518 and an oxygen vacancy 516 may be shown adjacent to one another; it is however understood that the representation is only for the purpose of illustrating the content of the memory layer 506, and a dopant atom 518 and an oxygen vacancy 516 may also be disposed not adjacent to one another.

In some aspects, different memory portions 508 may include different concentration (or amount, or number) of dopant atoms 518. The first memory portion 508a-1 may include a first concentration of dopant atoms 518, the second memory portion 508a-2 may include a second concentration of dopant atoms 518, the third memory portion 508a-3 may include a third concentration of dopant atoms 518, the fourth memory portion 508a-4 may include a fourth concentration of dopant atoms 518, etc. The concentration of dopant atoms in different memory portions 508 may be selected according to the oxygen vacancy profile to be provided in the memory layer 506.

The concentration of dopant atoms 518 in different memory portions 508 may be different, for example in case a memory portion 508 has a greater concentration of dopant atoms 518 than another memory portion 508, the concentration of dopant atoms 518 may be 10 times greater, 100 times greater, or 1000 times greater. In the exemplary representation in FIG. 5A, the first concentration of dopant atoms 518 may be different from the second concentration of dopant atoms 518. As an example, the second concentration of dopant atoms 518 may be greater than the first concentration of dopant atoms 518 (for example 10 times greater, 100 times greater, or 1000 times greater).

In some aspects, the third concentration of dopant atoms 518 may be equal to one of the first concentration of dopant atoms 518 or the second concentration of dopant atoms 518, for example to the first concentration of dopant atoms 518 in the exemplary representation in FIG. 5A. In other aspects, the third concentration of dopant atoms 518 may be different to both the first concentration of dopant atoms 518 and the second concentration of dopant atoms 518 (e.g., greater than both, or less than both, to provide an increasing or decreasing profile).

In some aspects, the fourth concentration of dopant atoms 518 may be different from the third concentration of dopant atoms 518. The fourth concentration of dopant atoms 518 may be equal to the other one of the first concentration of dopant atoms 518 or the second concentration of dopant atoms 518, for example to the second concentration of dopant atoms 518 in the exemplary representation in FIG. 5A. In other aspects, the fourth concentration of dopant atoms 518 may be different to the first concentration of dopant atoms 518, the second concentration of dopant atoms 518, and the third concentration of dopant atoms 518 (e.g., greater than all of them, or less than all of them, to provide an increasing or decreasing profile).

The same may apply to the other memory portions 508 (e.g., fifth to ninth memory portions 508a-5 to 508a-9) shown in FIG. 5A, or to any other memory portion not shown in FIG. 5A.

In some aspects, as shown for example in FIG. 5B, a memory cell 500b (additionally or alternatively to the configuration described in relation to FIG. 5A) may include a memory layer 506 including one or more separation portions 510 disposed between the plurality of memory portions 508, e.g. disposed between adjacent memory portions. In the exemplary configuration illustrated in FIG. 5B, the memory layer may include a (first) separation portion 510 disposed between a first memory portion 508b-1 and a second memory portion 508b-2. It is understood that the memory layer 506 of the memory cell 500b may include more than one separation portion (and may be subdivided in more than two memory portions), e.g. may include a second separation portion (e.g., disposed between the second memory portion 508b-2 and a third memory portion), a third separation portion (e.g., disposed between the third memory portion and a fourth memory portion), etc.

The one or more separation portions 510 may be configured to provide the desired oxygen vacancy profile in the memory layer 506. The one or more separation portions 510 may be understood, in some aspects, as one or more oxygen scavenging portions or oxygen absorbing portions configured to extract oxygen atoms from the lattice of the material of the memory layer 506, to provide oxygen vacancies 516 therein. The one or more separation portions 510 may be disposed at desired locations in the memory layer 506 (e.g., during fabrication) in accordance with the desired oxygen vacancy profile.

A separation portion 510 may include a material (referred to herein as separation material) different from the remanent-polarizable material in at least one of an oxygen content, a stoichiometry, and/or a type of the participating elements. In some aspects, a separation portion 510 may include a metal oxide having a different chemical composition with respect to the at least one metal oxide on which the remanent-polarizable material is based. In some aspects, a separation portion 510 may include a material including one or more (second) metal oxides distinct from the one or more (first) metal oxides that the remanent-polarizable material includes. In some aspects, a separation portion 510 may include a metal, e.g. La, Ti, Ta, as examples.

In some aspects, the remanent-polarizable material may include a first metal oxide having a first stoichiometric relationship among the participating elements, and the separation material may include a second metal oxide having a second stoichiometric relationship among the participating elements, different from the first stoichiometric relationship. In some aspects, the first metal oxide and the second metal oxide may include the same type of participating elements in a different stoichiometric relationship. The separation material may include at least one of $Hf_cO_d$, $Zr_eO_d$, $Si_cO_d$, $Y_cO_d$, $La_cO_d$, $Ti_cO_d$, $Ta_cO_d$, wherein the subscripts "c" and "d" may indicate the number of the respective atom in the separation material. At least one of the subscripts "c" and "d" may be different from the respective subscript "a" or "b" described in relation to the remanent-polarizable material.

In some aspects, the separation material may include a different oxygen content with respect to the remanent-polarizable material. In some aspects, the separation material may include a substantially stoichiometric oxygen content and the remanent-polarizable material may include a sub-stoichiometric oxygen content. Illustratively, the separation material may initially include a metal (e.g., La, Ti, Ta), which is then oxidized upon scavenging oxygen from the lattice of the remanent-polarizable material.

A thickness of a memory portion 508 (e.g., of the first memory portion 508b-1 and/or of the second memory portion 508b-2) and a thickness of a separation portion 510 may be selected in accordance with the desired oxygen vacancies profile. As a numerical example, a separation portion 510 may include a thickness in the range from about 0.1 nm to about 2 nm, for example in the range from about 0.2 nm to about 0.5 nm. Illustratively, a separation portion 510 may be disposed at periodic (or aperiodic) intervals after a desired thickness of memory portion 508, to provide the desired oxygen vacancy profile.

In some aspects, each separation portion 510 has a same thickness. In other aspects, different separation portions may have different thickness, e.g. at least a first separation portion 510-1 may have a thickness different from a second separation portion 510-2. In some aspects, the one or more memory portions 508 and the one or more separation portions 510 may have a same thickness. In other aspect, at least one memory portion 508 may have a different thickness with respect to a separation portion 510.

Figure 5C:
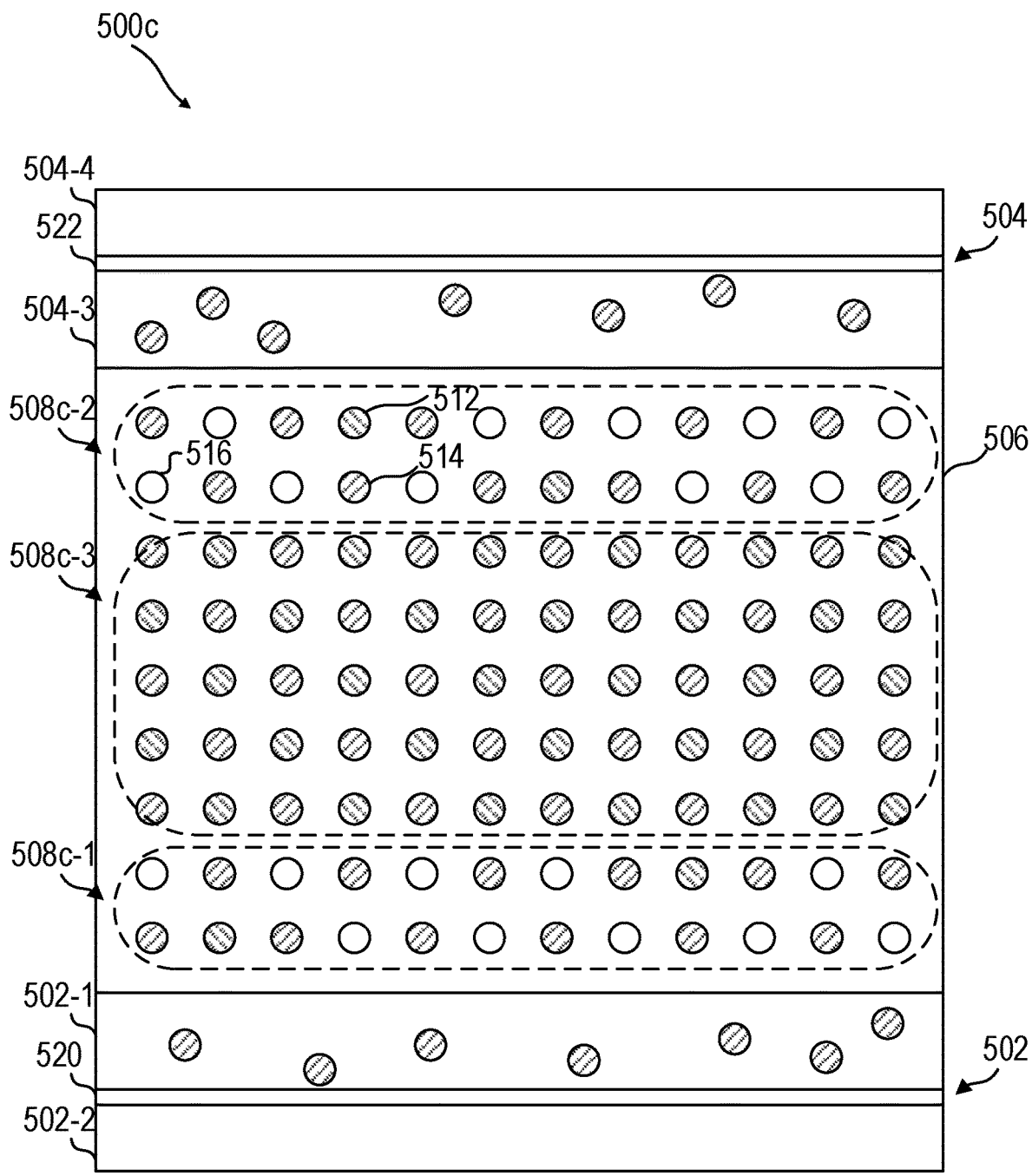

In some aspects, as shown for example in FIG. 5C (additionally or alternatively to the configuration described in relation to FIG. 5A and FIG. 5B), a memory cell 500c may include at least one of the first electrode 502 or the second electrode 504 adapted to induce a desired oxygen vacancy profile in the memory layer 506. The memory cell 500c may include at least one multilayer electrode adapted to extract oxygen from a desired portion of the memory layer 506. A sub-stoichiometric layer may be provided at the interface between the memory layer 506 and an electrode via electrode modification.

In the exemplary representation in FIG. 5C, the first electrode 502 may include a first electrode layer 502-1, a second electrode layer 502-2, and a first functional layer 520 disposed between the first electrode layer 502-1 and the second electrode layer 502-2. The first electrode layer 502-1 of the first electrode 502 may be in direct contact with the memory layer 506 (e.g., with a first memory portion 508c-1).

The second electrode 504 may include a third electrode layer 504-3, a fourth electrode layer 504-2, and a second functional layer 522 disposed between the third electrode layer 504-3 and the fourth electrode layer 504-3. The third electrode layer 504-3 of the second electrode 504 may be in direct contact with the memory layer 506 (e.g., with a second memory portion 508c-2).

At least one of the first electrode 502 and/or the second electrode 504 may include an adapted electrode layer (e.g., the first electrode layer 502-1 or the third electrode layer 504-3) configured to extract oxygen from the memory layer 506. The adapted electrode layer may include a material having a relatively high affinity for oxygen, illustratively the adapted electrode layer may include a material that may scavenge oxygen from the memory layer 508.

In the representation in FIG. 5C, the first electrode layer 502-1 of the first electrode 502 may be configured to extract oxygen from a first memory portion 508c-1 of the memory layer 506, and the third electrode layer 504-3 of the second electrode 504 may be configured to extract oxygen from a second memory portion 508c-2 of the memory layer 506. As an example a material of an adapted electrode layer configured to extract oxygen from the memory layer 506 (e.g., a material of at least one of the first electrode layer 502-1 and/or of the third electrode layer 504-3) may include at least one of: Ti, La, Ta. It is understood that also one of the electrodes 502, 504 may be a multilayer electrode, e.g. only one of the first electrode 502 or the second electrode 504 may include an adapted electrode layer.

A thickness of an adapted electrode layer configured to extract oxygen from a memory portion 508 may be selected in accordance with the desired oxygen extraction depth in the memory layer 506, illustratively with the desired extent in the memory layer 506 of a region from which oxygen is or should be extracted. An adapted electrode layer (e.g., the first electrode layer 502-1 and/or the third electrode layer 504-3) may include a thickness configured to provide a desired oxygen extraction from the memory layer 506 e.g. a thickness configured to provide a memory portion 508 with a desired thickness in which a concentration of oxygen vacancies is increased. Illustratively, the first electrode layer 502-1 may include a first thickness configured to provide a first memory portion 508c-1 having a desired thickness (a first memory portion 508c-1 having a greater concentration of oxygen vacancies with respect to a third memory portion 508c-3, e.g. with respect to a central memory portion). The third electrode layer 504-3 may include a third thickness configured to provide a second memory portion 508c-2 having a desired thickness (a second memory portion 508c-2 having a greater concentration of oxygen vacancies with respect to a third memory portion 508c-3, e.g. with respect to a central memory portion). As a numerical example, an adapted electrode layer may include a thickness in the range from about 0.1 nm to about 5 nm, for example from about 0.2 nm to about 2 nm, for example from about 0.5 nm to about 1 nm.

An adapted electrode layer in direct contact with the memory layer 506 may include a greater concentration of oxygen with respect to the adjacent memory portion(s) 508. In the exemplary configuration in FIG. 5C, the first electrode layer 502-1 of the first electrode 502 may include a greater concentration of oxygen with respect to the first memory portion 508c-1, and the third electrode layer 504-3 of the second electrode 504 may include a greater concentration of oxygen with respect to the second memory portion 508c-2.

A functional layer (e.g., the first functional layer 520, and/or the second functional layer 522) may be present in an electrode including an adapted electrode layer, and may be configured prevent diffusion of oxygen through the remaining part of the respective electrode. Illustratively, a functional layer may be configured to prevent diffusion of oxygen (scavenged from the memory layer) into the other (e.g., non-adapted) electrode layers not in direct contact with the memory layer 506 (for example in the second electrode layer 502-2 and/or in the fourth electrode layer 504-4 in the representation in FIG. 5C).

In some aspects, a functional layer may be configured to provide an oxygen diffusion barrier to reduce or prevent diffusion of oxygen through the respective electrod. A functional layer may be configured to reduce or prevent diffusion of oxygen between electrode layers. In the representation in FIG. 5C, the first functional layer 520 may be configured to reduce or prevent diffusion of oxygen from the first electrode layer 502-1 to the second electrode layer 502-2. The second functional layer 522 may be configured to reduce or prevent diffusion of oxygen from the third electrode layer 504-3 to the fourth electrode layer 504-4.

In some aspects, a functional layer (e.g., the first functional layer 520 and/or the second functional layer 522) may be configured to absorb oxygen, e.g. may be configured as an oxygen trapping layer. A material of the functional layer (e.g., chromium or ruthenium) may have affinity for oxygen, such that oxygen is absorbed in the functional layer forming an oxide. After formation of the oxide, further oxidation of the material of the functional layer may be prevented, as well as of the remaining (non-adapted) electrode layer(s).

In some aspects, a functional layer (e.g., the first functional layer 520 and/or the second functional layer 522) may be electrically conductive, e.g. a functional layer may be an oxidic electrode layer, or illustratively an electrically conductive oxygen barrier. As an example, a functional layer may include a material including an electrically conductive oxide material or an electrically conductive nitride material, e.g., tantalum nitride, indium oxide, copper silicide, tungsten nitride, titanium nitride, ruthenium oxide, rhenium oxide, iridium oxide, as examples.

A location of the functional layer within the respective electrode may be selected in accordance with a desired confining of oxygen in the electrode. Illustratively, a functional layer may be provided to control the localization of oxygen ions at the interface.

The electrode layers not in direct contact with the memory layer 506 may be not limited in terms of material, thickness, or other structural properties. A material of an electrode layer not in direct contact with the memory layer 506 (e.g., a material of the second electrode layers 502-2, and/or of the fourth electrode layer 504-4) may include at least one of Platinum (Pt), Iridium (Ir), Rhenium (Re), Rhodium (Rh), Ruthenium (Ru), Titanium (Ti), Osmium (Os), Molybdenum (Mo), Chromium (Cr), Tungsten (W), Aluminum (Al), Gold (Au), Cobalt (Co), as examples.

Figure 5D:
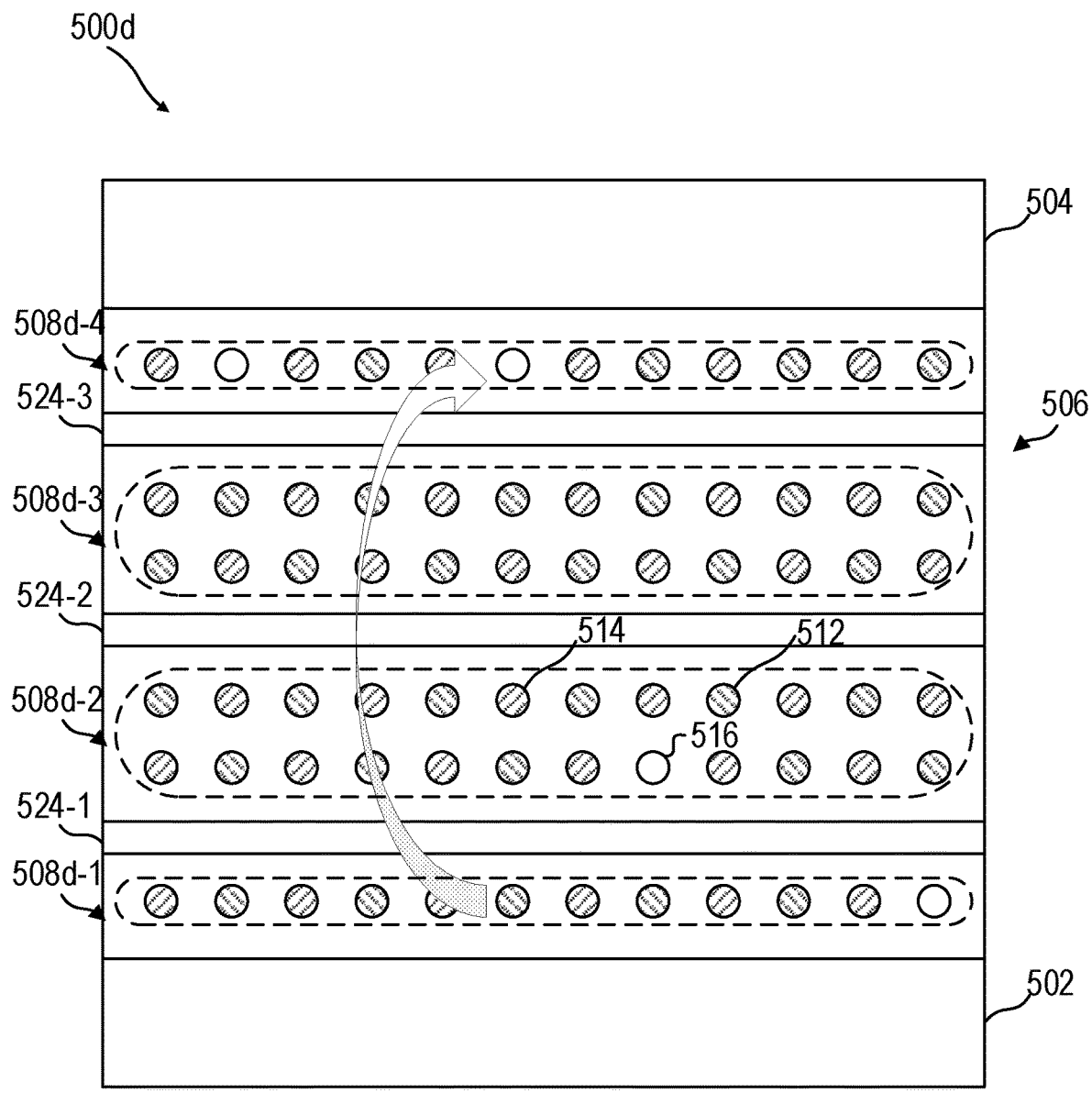

In some aspects, as shown for example in FIG. 5D (additionally or alternatively to the configuration described in relation to FIG. 5A, FIG. 5B, and FIG. 5C), a memory cell 500d may include a memory layer 506 including a plurality of memory portions 508 (e.g., first to fourth memory portions 508d-1, 508d-2, 508d-3, 50d8-4) and one or more functional portions 524 (e.g., first to third functional portions 524-1, 524-2, 524-3) disposed between the plurality of memory portions 508. A functional portion 524 may also be referred to herein as ion conductor portion 524.

A functional portion 524 may be disposed between two memory portions 508, e.g. in the exemplary configuration in FIG. 5D, the first functional portion 524-1 may be disposed between the first memory portion 508d-1 and the second memory portion 508d-2, the second functional portion 524-2 may be disposed between the second memory portion 508d-2 and the third memory portion 508d-3, and the third functional portion 524-3 may be disposed between the third memory portion 508d-3 and the fourth memory portion 508d-4.

A functional portion 524 may include an electrically insulating material. The electrically insulating material may have a substantive capability of conducting oxygen ions between the plurality of memory portions 508. Illustratively, each functional portion 524 may include or substantially consist of a material that is both electrically insulating and capable of conducting oxygen ions. A functional portion may include an electrically insulating material which allows a migration of oxygen ions between the memory portions 508 adjacent to the functional portion 524. Further illustratively, a functional portion 524 may include a material (also referred to herein as functional material) that is electrically insulating and an oxygen conductor to allow an exchange of oxygen ions between the plurality of memory portions 508. The functional portions 524 may be understood, in some aspects, as one or more ion conductor portions disposed between the plurality of memory portions 508.

The functional portions 524 may thus allow the formation of a desired oxygen vacancy profile in the memory layer 506 by allowing oxygen ions to travel through the memory layer 506, and may at the same time reduce or prevent a leakage current from the memory layer 506, thus improving the data retention capabilities of the memory cell 500d.

In some aspects, a functional portion 524 may include a material configured to be at a boundary between a first phase and a second phase, e.g. a material including a chemical composition of at least two types of atoms at or close to a phase boundary. As an example, the first phase may be a cubic/tetragonal phase, and the second phase may be a monoclinic phase. The functional material including two types of atoms at or close to a phase boundary may provide that oxygen may easily diffuse through the functional portion 524.

In some aspects a functional portion may include the remanent-polarizable material doped with at least one of dopant atom configured to induce a phase transition. As examples, the at least one dopant atom may include one of: Boron, Silicon, Germanium, Arsenic, Antimony, and/or Tellurium.

In some aspects, a functional portion 524 may be provided by inducing stress (e.g., by introducing crystal stress) in a memory portion 508, thus turning a memory portion 508 into a functional portion 524. The functional material may include a greater crystal stress with respect to the remanent-polarizable material of the memory portions 508. In some aspects, a functional portion 524 may include a same material as a memory portion (e.g., a material having a same chemical composition) but with an increased crystal stress.

In some aspects, the functional material may include a plurality of grains having an average grain size less than an average grain size of a plurality of grains of the remanent-polarizable material. Illustratively, small grains may be provided (e.g., provoked) in the material of a functional portion 524, which may provide separate paths for oxygen ion conduction.

In some aspects, the functional material may include a material configured to be transparent to oxygen conduction but blocks electron conduction. The functional material may include an electrically insulating material which allows oxygen diffusion through a functional portion 524.

Figure 6:
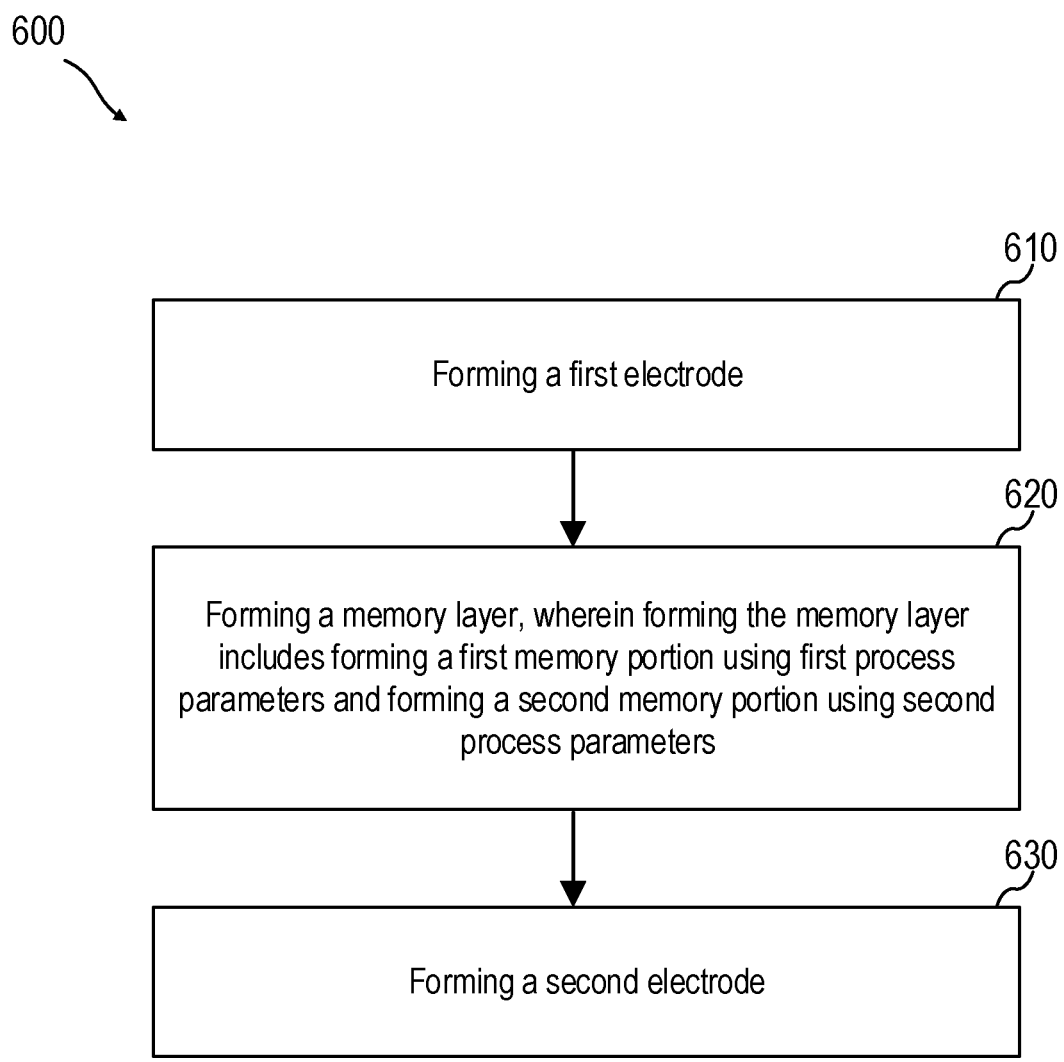
FIG. 6 shows a schematic flow diagram of a method of forming a memory cell, according to various aspects.

FIG. 6 illustrates a schematic flow diagram of a method 600 for forming a memory cell, according to various aspects. In some aspects, the method 600 for forming a memory cell may include one or more processes configured to form the memory cell 500a, 500b, 500c, 500d as described herein.

According to various aspects, the method 600 for forming a memory cell may include: in 610, forming a first electrode, in 620 forming a memory layer and in 630 forming a second electrode. The first electrode, the memory layer, and the second electrode may form a capacitive memory structure. In some aspects, the method 600 may include forming the memory layer in direct contact with the first electrode, and forming the second in direct contact with the memory layer. In some aspects, the memory layer formed in process 620 of the method 600 may include a memory layer 506 as described herein. In some aspects, the first electrode formed in process 610 of the method 600 may include an electrode 322, 402, 502 as described herein. In some aspects, the second electrode formed in process 630 of the method 600 may include an electrode 326, 404, 504 as described herein.

Forming the memory layer 620 may include forming a first memory portion using first process parameters, and forming a second memory portion using second process parameters different from the first process parameters.

In various aspects, the first process parameters may differ from the second process parameters in at least one of: an oxygen precursor, a pulse time, an oxygen concentration, a partial pressure of oxygen, an oxygen flow, a doping, a processing temperature, and an oxygen plasma treatment.

In various aspects, forming the first memory portion may include forming a material of the first memory portion using a first oxygen precursor, and forming the second memory portion may include forming a material of the second memory portion using a second oxygen precursor different from the first oxygen precursor. The first oxygen precursor and the second oxygen precursor may differ from one another in at least one of a chemical composition, or an oxygen content. The oxygen content of an oxygen precursor may be adapted according to the desired oxygen vacancy profile, e.g. may be increased or decreased depending on the desired concentration of oxygen vacancies in the memory portion being formed. As an example, a second oxygen content of the second oxygen precursor may be less than a first oxygen content of the first oxygen precursor (for example, the first oxygen precursor may be $O_3$, and the second oxygen precursor may be $H_2O$).

In various aspects, forming the first memory portion may include forming a material of the first memory portion using a first pulse time for depositing an oxygen precursor, and that forming the second memory portion may include forming a material of the second memory portion using a second pulse time for depositing an oxygen precursor different from the first pulse time. The pulse time may be adapted according to the desired oxygen vacancy profile. Reducing a pulse time may provide sub-saturating with oxygen a memory portion being formed, illustratively it may provide forming a sub-stoichiometric memory portion. As an example, the second pulse time may be less than the first pulse time (e.g., 10% less, 30% less, or 50% less).

In various aspects, forming the first memory portion may include forming a material of the first memory portion using a first oxygen flow, and forming the second memory portion may include forming a material of the second memory portion using a second oxygen flow different from the first oxygen flow. The oxygen flow (e.g., a volume of oxygen per minute or a volume of oxygen per second) may be adapted according to the desired oxygen vacancy profile, e.g. may be increased or decreased depending on the desired concentration of oxygen vacancies in the memory portion being formed. In some aspects, an oxygen flow used during forming a memory portion may vary with respect to the oxygen flow used during forming another memory portion by at least 5%, or at least 20%, or at least 50%, or at least 100%. As an example, a first oxygen flow with which the first memory portion is formed (e.g., deposited) may be 5% greater than a second gas flow with which the second memory portion is formed, in some aspects 10% greater, or 50% greater, or 100% greater.

In various aspects, forming the first memory portion may include forming a material of the first memory portion using a first partial pressure of oxygen, and forming the second memory portion may include forming a material of the second memory portion using a second partial pressure of oxygen different from the first partial pressure of oxygen. The partial pressure of oxygen may be adapted according to the desired oxygen vacancy profile, e.g. may be increased or decreased depending on the desired concentration of oxygen vacancies in the memory portion being formed. In some aspects, a partial pressure of oxygen used during forming a memory portion may vary with respect to the partial pressure of oxygen used during forming another memory portion by at least 5%, or at least 20%, or at least 50%, or at least 100%. As an example, a first partial pressure of oxygen with which the first memory portion is formed (e.g., deposited) may be 5% greater than a second partial pressure of oxygen with which the second memory portion is formed, in some aspects 10% greater, or 50% greater, or 100% greater.

In various aspects, forming the first memory portion may include a first processing temperature and that forming the second memory portion may include a second processing temperature different from the first processing temperature. The processing temperature of oxygen may be adapted according to the desired oxygen vacancy profile, e.g. to induce migration of oxygen away from a memory portion being formed. In some aspects, a processing temperature used during forming a memory portion may vary with respect to the processing temperature used during forming another memory portion by at least 5%, or at least 20%, or at least 50%, or at least 100%. As an example, a second processing temperature with which the second memory portion is formed (e.g., deposited) may be 5% greater than a first processing temperature with which the first memory portion is formed, in some aspects 10% greater, or 50% greater, or 100% greater. In various aspects, forming the second memory portion may include performing an anneal step at a temperature configured to drive oxygen out of the second memory portion.

In various aspects, forming a memory portion may include introducing one or more dopant atoms during forming the memory portion (e.g., at least one of Yttrium or Scandium, as examples). As an example, forming the second memory portion may include forming a material of the second memory portion introducing at least one dopant atom. Forming the first memory portion may include forming a material of the first memory portion without introducing any dopant atom or introducing at least one different dopant atom with respect to the second memory portion.

In various aspects, forming different memory portions may include using different precursor gases. A precursor gas may be selected in accordance with the desired oxygen profile, e.g. a precursor gas inducing a greater or less oxygen content in a memory portion being formed may be selected in accordance with the desired oxygen profile. As an example, oxygen plasma may be used during forming of a memory portion intended to have less concentration of oxygen vacancies (e.g., during forming the second memory portion). Illustratively, forming the first memory portion may include using a first precursor gas and forming the second memory portion may include using a second precursor gas different from the first precursor gas. The second precursor gas may include an oxygen plasma (and the first precursor gas may include $H_2O$, as an example).

In various aspects, at least one of forming the first electrode or forming the second electrode may include forming a first electrode layer using first process parameters and forming a second electrode layer using second process parameters different from the first process parameters. Illustratively, at least one of forming the first electrode or forming the second electrode may include varying the process parameters during forming the electrode to provide varying properties across the electrode. At least one of forming the first electrode or forming the second electrode may include forming an adapted electrode layer configured to extract oxygen from the memory layer, e.g. may include depositing at least one material configured to scavenge oxygen from the memory layer (for example La, Ti, or Ta).

In some aspects, the method 600 may include one or more layering and patterning processes for processing the memory cell, e.g. for forming the memory layer and/or the electrodes. In some aspects, a mask may be used. A mask may include a material that serves for transferring a photo-lithography mask pattern into one or more material layers. A mask may include, for example, a positive or negative photo resist (also referred to as soft mask) or a hard mask. The photo resist itself may be patterned by standard lithography processes. The patterning of the hard mask material may include a combination of photo resist patterning followed by etch of the hard mask material (e.g. wet or dry chemical etching). However, any other suitable process may be used to transfer a desired pattern into one or more material layers.

In various aspects, forming an electrode 610, 630 may include depositing a plurality of electrode layers or growing a plurality of electrode layers. The process parameters associated with an electrode layer may deposition parameters or growing parameters. The deposition or the growth of an electrode layer may be carried out with technologies known in the art, for example by means of sputtering, electron-beam evaporation, chemical vapor deposition, thermal vapor deposition, nucleation, and the like. In some aspects, the deposition or the growth of an electrode layer may be carried out in a vacuum chamber.

In various aspects, forming the adapted electrode layer may include using a different precursor material with respect to forming the other electrode layers. Forming the adapted electrode layer may include using at least one of La, Ti, Ta as precursor material. Forming the memory layer 620 may include forming the memory layer in direct contact with the adapted electrode layer.

In some aspects, the method 600 may include forming a functional layer between two electrode layers, e.g., the method 600 may include forming a functional layer after forming one electrode layer and prior to forming the adapted electrode layer (or vice versa). In some aspects, the functional layer formed in the method 600 may include a functional layer 522, 524 as described herein. The functional layer may be configured as an oxygen diffusion barrier to reduce or prevent an oxygen diffusion from an adapted electrode layer to other electrode layer(s).

Figure 7:
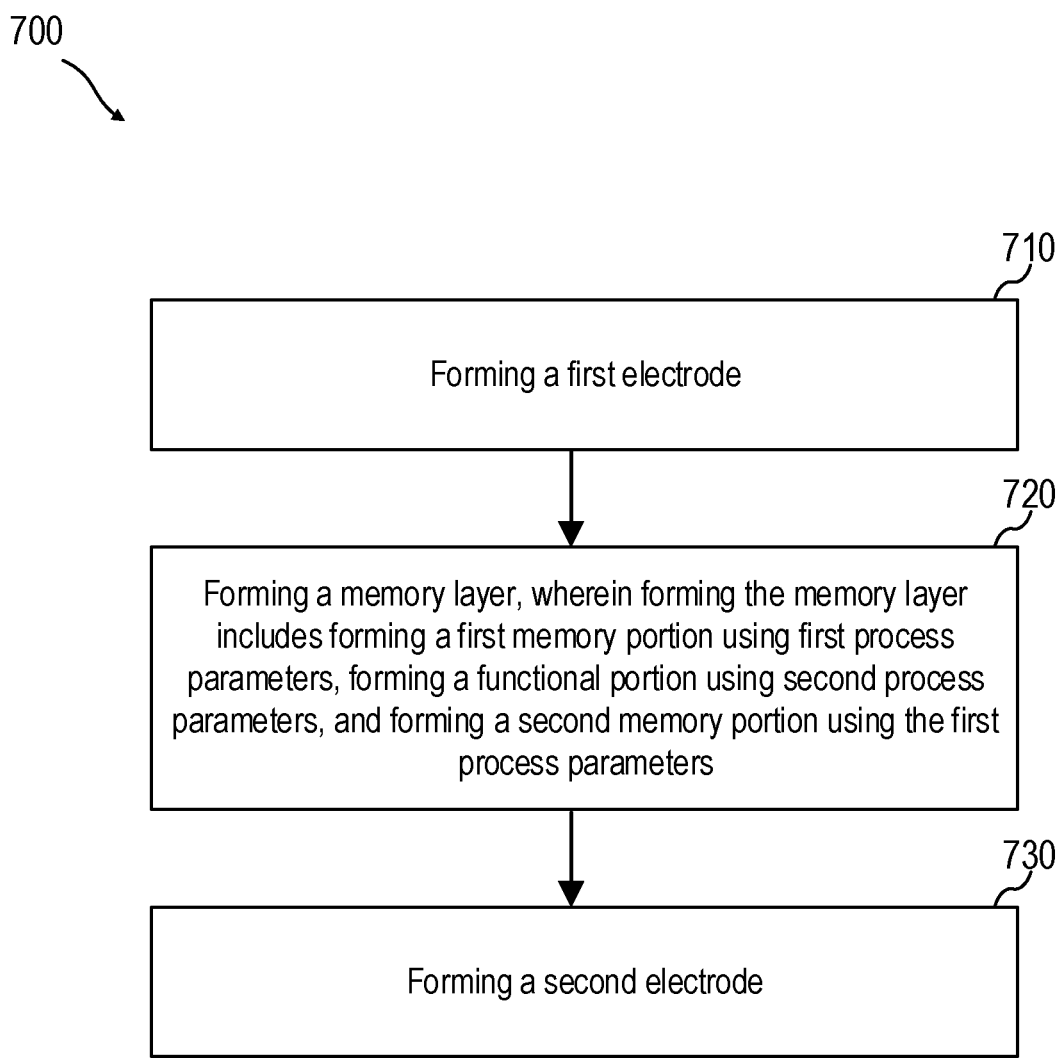
FIG. 7 shows a schematic flow diagram of a method of forming a memory cell, according to various aspects.

FIG. 7 illustrates a schematic flow diagram of a method 700 for forming a memory cell, according to various aspects. In some aspects, the method 700 for forming a memory cell may include one or more processes configured to form the memory cell 500a, 500b, 500c, 500d as described herein.

According to various aspects, the method 700 method of forming a memory cell, the method including: forming a first electrode 710; forming a memory layer 720; and forming a second electrode 730.

Forming the memory layer may include forming a first memory portion using first process parameters, forming a functional portion using second process parameters, and forming a second memory portion using the first process parameters.

The first process parameters may differ from the second process parameters in at least one of an oxygen precursor, a pulse time, an oxygen concentration, a partial pressure of oxygen, an oxygen flow, a doping, a processing temperature, and an oxygen plasma treatment, as described above in relation to the method 600. Illustratively, the process parameters may vary to provide one or more functional portions between the memory portions, the one or more functional portions configured to be electrically insulating and having a substantive capability of conducting oxygen ions between the plurality of memory portions.

In this disclosure, various capacitor device structures and various methods of forming a capacitive memory structure are illustrated. The formation of the capacitive memory includes a control of the amount and spatial location of oxygen vacancies within the memory layer of the capacitive memory structure. The memory layer may be a remanent-polarizable layer and the control of the amount and spatial location of oxygen vacancies within the remanent-polarizable layer may enhance the polarization properties of the remanent-polarizable layer, e.g., the control of the amount and spatial location of oxygen vacancies within the remanent-polarizable layer may increase the retention, increase the volume fraction of material that is actually remanently polarizable, and/or allow a manufacture of smaller (thinner or with less footprint) capacitive memory structure, only as examples.

According to various aspects, electrical dipoles may be formed at specific locations within the memory layer. In some aspects, the oxygen vacancy movement inside the memory layer of the capacitive memory structure may be controlled. The oxygen vacancy positioning may support a formation of a remanent polarizable crystal structure from a source material. The source material may be an amorphous layered mixture of various materials, e.g., of HfO and/or ZrO, optionally including Y, Si, SiO, and/or YO, as examples. During a temperature treatment, the source material may be crystallized and a remanent-polarizable layer including at least a fraction of remanent-polarizable material may be formed.

In some aspects, a remanently polarizable state is believed to be achieved by one or more effects that may or may not include one or more of the following aspects:
stabilizing a non-centrosymmetric crystal phase regarded as classical ferroelectricity;
defect dipoles itself, e.g. created by oxygen vacancies; and/or
classical ferroelectricity stabilized by introducing defect dipoles, oxygen vacancies, and/or by controlling or inducing a movement of oxygen vacancies.

According to various aspects, it was found that a control of oxygen vacancies in the material layer that causes the remanent polarization may be crucial; independently of the description of the nanoscopic origin of the remanent polarization.

According to various aspects, an oxygen vacancy concentration may be modified within an insulator to cause or enhance remanent polarization properties in the insulator. As an example, sub-stoichiometric portions (e.g., layer portions) may be formed inside a dielectric thin film, wherein the sub-stoichiometric portions have a lack of oxygen.

According to various aspects, various sub-layers of a memory layer or various sub-layers of a source layer used to form the memory layer may be formed to have distinct oxygen vacancy concentrations. According to various aspects, a memory layer or a source layer may be formed that include various sub-layers with different distances and/or different positions in the memory layer.

Various methods may be used to introduce sub-stoichiometry within an insulator layer, as described in the following.

In some aspects method or a controlled apparatus may be used to incorporate layers/areas of different stoichiometry into a dielectric layer that is used as a memory layer in a capacitive memory structure. During atomic layer deposition (ALD), for example, different ALD oxygen precursors (e.g. $H_2O$, $O_3$) may be used to cause a variation in the oxygen content in the formed thin film and therefore a variation in the oxygen vacancy concentration. Alternatively or in addition, pulse times may be varied during ALD to cause a variation in the oxygen content in the formed thin film and therefore a variation in the oxygen vacancy concentration, e.g. shorter pulse times may lead to a subsaturation with oxygen. As an example, the insulator ALD may be started with H$_2$O as pre-cursor and a pulse time of 5 s for first 10 oxygen precursor cycles, subsequently, the pulse time is changed to 0.1 s for every 5th oxygen precursor pulse.

During physical vapor deposition (PVD), for example, different PVD oxygen concentration, different partial pressures, a different oxygen gas flow may be used during deposition to cause a variation in the oxygen content in the formed thin film and therefore a variation in the oxygen vacancy concentration. As an example, the insulator PVD deposition may be started with an oxygen gas flow of 1 sccm and after 1 nm of thin film deposition a sinusoidal change in oxygen gas flow with time may be applied.

According to various aspects, a variation in the oxygen content in a formed thin film and therefore a variation in the oxygen vacancy concentration may be caused by doping (e.g. in situ doping during deposition) a host material with atoms that have different coordination than the atoms (cations) of the host material; e.g. HfO$_2$ and/or ZrO$_2$ may be doped with Y$_2$O$_3$ leads to one oxygen vacancy for every two Y ions. The (e.g., in-situ) doping may be used to form layers (e.g., having a thickness of less than a unit cell or a thickness of only one to five unit cells) of an oxide that has different cations compared to the host material lattice (e.g. Y2O3 layers in between HfO$_2$ bulk). As an example, an ion may be introduced that has a lower valency than host cation (e.g. La$^{3+}$ within HfO$_2$ lattice) (e.g., every 2 nm) in the memory layer via pulsing a different precursor (1 to several pulses) and/or via sputtering from different targets.

According to various aspects, a variation in the oxygen content in a formed thin film and therefore a variation in the oxygen vacancy concentration may be caused by doping (e.g. in situ doping during deposition) a host material with (transition) metal elements that have high oxygen affinity and may therefore scavenge oxygen from its surroundings. As an example, one or more Ti, Hf, or Ta layers may be introduced in between the host material.

According to various aspects, a variation in the oxygen content in a formed thin film and therefore a variation in the oxygen vacancy concentration may be caused by one or more in-situ anneal steps during deposition of the memory layer to partially drive out oxygen and/or to increase the oxygen content in the host material. As an example, a spike anneal may be carried out within the deposition chamber (e.g., after every 2 nm of deposited host material) under controlled oxygen gas flow.

According to various aspects, a host material may be an oxide that is used as a main component to form the memory layer.

According to various aspects, a variation in the oxygen content in a formed thin film and therefore a variation in the oxygen vacancy concentration may be caused by one or more in-situ oxygen plasma treatments during deposition of the memory layer. As an example, oxygen plasma may be utilized (e.g., instead of e.g. H$_2$O as precursor gas) at defined positions within the host material.

According to various aspects, an oxygen vacancy location may be modified within an insulator (e.g., within a host material) to cause or enhance remanent polarization properties in the insulator. As an example, sub-stoichiometric portions (e.g., layer portions) may be formed inside the insulator at specific locations, wherein the sub-stoichiometric portions have a lack of oxygen.

According to various aspects, various sub-layers of a memory layer or various sub-layers of a source layer used to form the memory layer may be formed to have distinct oxygen vacancy concentration at specific locations in the layer. According to various aspects, a memory layer or a source layer may be formed that include various sub-layers with different positions in the memory layer. Various methods may be used to introduce sub-stoichiometry within an insulator layer at predefined positions, as described in the following.

In some aspects method or a controlled apparatus may be used to incorporate layers/areas of different stoichiometry at predefined positions in a dielectric layer that is used as a memory layer in a capacitive memory structure. An exact positioning may be used to control the oxygen vacancy movement (e.g., by changing the energy barrier for oxygen vacancy movement). The oxygen vacancy movement may occur in the case that an external electrical field may be applied to electrodes of the capacitive memory structure.

During layer deposition (e.g., ALD, CVD, PVD, as examples), for example, layers of different stoichiometry may be incorporated at specific locations in the host material.

This may be achieved during an ALD, according to various aspects, by using a predefined oxygen-precursor pulse sequence. As an example, the sequence of pulses may be modified arbitrarily, i.e. every 2nd or every 3rd oxygen precursor pulse may be of different duration and/or pulse width.

According to various aspects, layers of different stoichiometry may be incorporated at specific locations in the host material by varying the oxygen flow during a PVD used to deposit the desired thin film. A location dependent oxygen concentration profile in the host material may be created.

According to various aspects, particular positions within the host material (during the deposition process) may be chosen to dope/substitute with atoms that are different from the host lattice (e.g., forming and oxidic interlayer in the source material prior to an anneal).

According to various aspects, one or more particular positions within the host material may be selected (e.g., during the deposition process) to dope/substitute the host material with atoms that are different from the host lattice (e.g., forming and metallic interlayer in the source material prior to an anneal).

Furthermore, in-situ anneal steps and/or in-situ oxygen plasma steps may be used during deposition at specific locations in the host material.

According to various aspects, an oxygen vacancy concentration may be modified by providing an interface between the host material and a scavenging material. The host material may be the memory material of a memory layer of a capacitive memory structure. Therefore, an electrode may be needed to control the memory layer. According to various aspects, a bottom electrode and/or a top electrode of a capacitive memory structure may be modified to including the polarization properties of the memory material or memory layer disposed between the bottom electrode and the top electrode.

According to various aspects, a lower oxygen content and therefore a higher oxygen vacancy concentration may be introduced in an interface region that contacts the electrode of the capacitive memory structure. The electrode layer may have a predefined material and a predefined thickness that allows for a control of the amount of oxygen extraction from insulator. In some aspects, a conductive (or semiconducting or insulating) oxygen barrier may be formed in electrode to control localization of oxygen ions at the interface.

In some aspects method or a controlled apparatus may be used to forming a high-oxygen-vacancy-concentration layer at the electrode to memory layer interface by one or more of the following aspects.

The electrode may be configured to have a predefined chemical stoichiometry at the interface to the memory layer. The predefined chemical stoichiometry may be different from the chemical stoichiometry of the electrode bulk material. According to various aspects, the electrode may be configured to include one or more chemical elements that possess high oxygen affinity. According to various aspects, the electrode may include at least two separate electrode layers, whereas the electrode layer that is adjacent to the memory layer may be configured to have a high tendency to scavenge oxygen. According to various aspects, a thickness control may be used for the scavenging part of the electrode to define a predefined amount of oxygen to be scavenged. According to various aspects, a conductive oxygen barrier may be included in the electrode. The oxygen barrier may limit or define a thickness of the scavenging part of the electrode.

According to various aspects, an annealing step may be used after a first portion of the memory material or host material is deposited. This allows to control the oxygen extraction the interface.

Various examples to modify an electrode are described in the following.

According to various aspects, a TiN electrode may be formed. The scavenging part of the electrode may be formed by reducing the nitrogen amount (e.g. by reducing nitrogen flow into the deposition chamber, reducing partial pressure in deposition chamber, as example) during the deposition.

According to various aspects, a TiN electrode may be formed. The scavenging part of the electrode may be formed by co-sputtering of Ta or another metal into the TiN electrode. Alternatively, a layer of Ta or another metal may be deposited over the TiN bulk part of the electrode to thereby provide the scavenging part of the electrode with a certain thickness. The thickness of the scavenging layer may be increased to increase the amount of oxygen that can be scavenged and to increase the amount of oxygen vacancies introduced in the memory material that is in contact with the scavenging layer of the electrode.

According to various aspects, oxidic electrode or oxidic electrode portion may be formed as example for a conductive oxygen barrier. As an example, $RuO_x$ (x=2 for fully stoichiometric) may be a suitable material to form an conductive oxygen barrier.

According to various aspects, an anneal (e.g., a spike anneal) may be used after a portion (e.g., 2 nm) of the memory material or host material has been deposited on the scavenging part of the electrode.

According to various aspects, a memory layer may include one or more intermediate layers within the host material or memory material, wherein the one or more interlayers may be configured an oxygen and oxygen vacancy conductor. At the same time, the one or more interlayers may be electrically isolating, e.g., including a dielectric material, to reduce electron conductivity through the memory layer (e.g., to reduce a leakage current between the two electrodes of the capacitive memory structure).

There may be various suitable aspects that allow for an increase of the capability of a material to conduct oxygen ions and oxygen vacancies. As an example, the material, e.g., an insulator material, may be stabilized close to a chemical phase boundary. In some aspects, a dielectric material, e.g., HfO, ZrO, etc., may include a tetragonal or cubic phase and a monoclinic phase. Stabilizing the dielectric material at such a phase boundary may lead to a comparable high ion conductivity due to one of the following aspects: e.g., crystal stress may occur at phase transition and atomistic paths may be formed for the ion conduction.

According to various aspects, crystal stress may be introduced by other means to improve ion conductivity of a dielectric material (e.g., of a memory material). As an example, the lattice structure may be influenced by the electrodes, e.g. a desired texture may be induced from the bottom electrode during growth of the dielectric material epitaxially thereon.

Other measures to increase the ion conductivity may include reducing a formation of defect clusters between oxygen vacancies and dopant atoms. Other measures to increase the ion conductivity may include reducing an interaction between oxygen vacancies at high oxygen vacancy concentration. While increasing the ion conductivity, the intermediate layers may be configured such that the electron transport through the material may be reduced or may at least remain the same.

In some aspects method or a controlled apparatus may be used to increase oxygen ion conductivity in a material, e.g., in a host material, e.g., in a memory material.

Aspects to increase oxygen ion conductivity in a material may include doping and/or substituting a part of the material with foreign elements to induce a chemical phase transition, e.g., from tetragonal/cubic to monoclinic phase.

Aspects to increase oxygen ion conductivity in a material may include utilizing a crystalline electrode as template for the material such that lattice constants of the material will be influenced. In some aspects, an epitaxial pressure may be introduced in the material via the crystalline electrode. In other aspects, a specific crystal phase may be induced in the material via the crystalline electrode. In still other aspects, a specific metastable crystal phase (that may not be stable in thermodynamic equilibrium) may be induced in the material via the crystalline electrode.

Aspects to increase oxygen ion conductivity in a material may include introducing spatially separated paths of oxygen ion conduction.

Aspects to increase oxygen ion conductivity in a material may include incorporating one or more intermediate layers into the material that are substantially transparent to oxygen conduction but block electron conduction.

Some examples that may allow an increase of oxygen ion conductivity in a material may be described in the following. $HfO_2$ or any other host material may be doped, e.g., with Si, to provoke a phase transition at around 5 mol % dopant concentration from tetragonal/cubic to monoclinic phase. According to various aspects, TiN or any other metal, metal nitride, metal oxynitride, etc., may be grown columnar. This columnar grown layer may be used as template (e.g., seed layer) for the host material, e.g., for $HfO_2$. According to various aspects, a grain structure including comparable small grains may be provoked, e.g. by rapid thermal processing, in order to spatially separate oxygen conduction via grain boundaries. A material that may be an oxygen vacancy and/or oxygen ion conductor and at the same time electrically insulating may be $SiO_x$.

According to various aspects, a capacitive memory structure may include a layer stack including a metal/semiconductor layer, a remanent polarizable layer, an insulator layer, and a metal/semiconductor layer may be provided. The insulator layer may have one or more functionalities, e.g., influence the oxygen vacancy concentration, influence the oxygen vacancy conduction properties, etc.

The aspects described herein may allow enhancing the polarization properties of the memory material or the memory layer including the memory material. Therefore, one or more of this aspects may be applied to any device or method that is related to a remanent-polarizable material or remanent-polarizable layer.

The capacitive memory structure may include planar electrodes. In other aspects, the capacitive memory structure may be configured as 3D capacitor including, for example, angled or curved electrodes.

According to various aspects, a memory cell as described herein may be integrated in an electronic device (e.g., e.g., a microcontroller, a central processing unit, a system on a chip (SoC), a memory device), for example in a same electronic device with other components, such as components to control logic operations and/or input/output operations of the electronic device. Illustratively, one or more memory transistors may be integrated (and formed) on or in a same carrier as one or more logic transistors and/or one or more input/output transistors.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

The term "lateral" used with regards to a lateral dimension (in other words a lateral extent) of a structure, a portion, a structure element, a layer, etc., provided, for example, over and/or in a carrier (e.g. a layer, a substrate, a wafer, etc.) or "laterally" next to, may be used herein to mean an extent or a positional relationship along a surface of the carrier. That means, in some aspects, that a surface of a carrier (e.g. a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g. perpendicular to the main processing surface of a carrier).

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term region used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.,). In some aspects, the continuous region of a semiconductor portion may be provided by semiconductor material having only one dominant doping type.

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g. parallel to the main processing surface) the "thickness" of the layer formed on the surface of the support may be the same as the height of the layer.

In the following, various aspects of this disclosure will be illustrated.

Example 1a is a memory cell including: a first electrode; a second electrode; and a memory layer disposed between the first electrode and the second electrode, wherein the memory layer includes two or more memory portions and one or more ion conductor portions disposed between the two or more memory portions, wherein each of the two or more memory portions includes a remanent-polarizable material based on at least one metal oxide, wherein each of the one or more ion conductor portions includes an electrically insulating material, and wherein the electrically insulating material has a substantive capability of conducting oxygen ions to allow an exchange of oxygen ions between the two or more memory portions.

Another Example 1a is a memory cell including: a first electrode; a second electrode; and a memory layer disposed between the first electrode and the second electrode, wherein the memory layer includes two or more memory portions and one or more ion conductor portions disposed between the two or more memory portions, wherein each of the two or more memory portions includes a remanent-polarizable material based on at least one metal oxide, wherein each of the one or more ion conductor portions includes a ion conductor material, wherein the ion conductor material is electrically insulating and an oxygen conductor to allow an exchange of oxygen ions between the two or more memory portions.

Another Example 1a is a memory cell including a first electrode; a second electrode; and a memory layer disposed between the first electrode and the second electrode, wherein the memory layer includes two or more memory portions and one or more ion conductor portions disposed within the two or more memory portions and/or between the two or more memory portions, wherein each of one or more ion conductor portions is configured to allow an exchange of oxygen ions between at least two memory portions of the two or more memory portions.

In Example 2a, the subject-matter of Example 1a may optionally further include that each of the one or more ion conductor portions includes a material configured to be at a boundary between a first phase and a second phase.

In Example 3a, the subject-matter of Example 1a or 2a may optionally further include that each of the one or more ion conductor portions includes a material including a chemical composition of at least two sorts of atoms at or close to a phase boundary between a first phase and a second phase.

In Example 4a, the subject-matter of Example 2a or 3a may optionally further include that the first phase is one of a cubic/tetragonal phase and a monoclinic phase, and that the second phase is the other one of a cubic/tetragonal phase and a monoclinic phase.

In Example 5a, the subject-matter of any one of Examples 1a to 4a may optionally further include that each of the one or more ion conductor portions includes a material having a greater crystal stress with respect to the remanent-polarizable material of the two or more memory portions.

In Example 6a, the subject-matter of any one of Examples 1a to 5a may optionally further include that each of the one or more ion conductor portions includes a material including a plurality of grains having an average grain size less than an average grain size less of a plurality of grains of the remanent-polarizable material of the two or more memory portions.

In Example 7a, the subject-matter of any one of Examples 1a to 6a may optionally further include that each of the one or more ion conductor portions includes the remanent-polarizable material of the two or more memory portions doped with at least one of dopant atom configured to induce a phase transition.

In Example 8a, the subject-matter of Example 7a may optionally further include that the at least one dopant atom includes one of: Boron, Silicon, Germanium, Arsenic, Antimony, and/or Tellurium.

In Example 9a, the subject-matter of any one of Examples 1a to 8a may optionally further include that at least one of the first electrode or the second electrode includes a columnar structure.

In Example 10a, the subject-matter of any one of Examples 1a to 9a may optionally further include that the two or more memory portions include a first memory portion having a first concentration of oxygen vacancies, and a second memory portion having a second concentration of oxygen vacancies different from the first concentration of oxygen vacancies.

In Example 11a, the subject-matter of Example 10a may optionally further include that the second concentration of oxygen vacancies is greater than the first concentration of oxygen vacancies. The second concentration of oxygen vacancies may be at least 10 times greater than the first concentration of oxygen vacancies (e.g., at least 100 times greater or at least 1000 times greater).

In Example 12a, the subject-matter of Example 10a or 11a may optionally further include that at least one of the first concentration or the second concentration of oxygen vacancies is greater than $10^{20}$ vacancies/cm$^3$.

In Example 13a, the subject-matter of any one of Examples 10a to 12a may optionally further include that the second memory portion is a sub-stoichiometric portion with respect to the first memory portion.

In Example 14a, the subject-matter of any one of Examples 1a to 13a may optionally further include that the memory layer includes one or more separation portions disposed between the two or more memory portions.

In Example 15a, the subject-matter of Example 14a may optionally further include that the remanent-polarizable material is based on at least one metal oxide, and that each of the one or more separation portions includes a separation material including a metal oxide having a different chemical composition than the at least one metal oxide.

In Example 16a, the subject-matter of Example 15a may optionally further include that the remanent-polarizable material includes one or more first metal oxides, and that each of the one or more separation portions includes a separation material including one or more second metal oxides distinct from the one or more first metal oxides.

In Example 17a, the subject-matter of Example 16a may optionally further include that the one or more first metal oxides include at least one of: $Hf_aO_b$, $Zr_aO_b$, $Si_aO_b$, $Y_aO_b$, and that the one or more second metal oxides include at least one of $Hf_cO_d$, $Zr_cO_d$, $Si_cO_d$, $Y_cO_d$, wherein the subscript "a" represents a different number with respect to the subscript "c" and/or wherein the subscript "b" represents a different number with respect to the subscript "d".

In Example 18a, the subject-matter of any one of Examples 15a to 17a may optionally further include that the separation material is different from the remanent-polarizable material in at least one of an oxygen content, a stoichiometry, and/or a type of participating elements.

In Example 19a, the subject-matter of any one of Examples 15a to 18a may optionally further include that the separation material includes at least one of: Lanthanum, Titan, and/or Tantalum.

In Example 20a the subject-matter of any one of Examples 15a to 19a may optionally further include that the remanent-polarizable material is based on a metal oxide including a first metal and a first oxygen content, and that the separation material includes a metal oxide including the first metal and a second oxygen content greater than the first oxygen content.

In Example 21a, the subject-matter of any one of Examples 1a to 20a may optionally further include that at least one of the first electrode or the second electrode includes a first electrode layer, a second electrode layer, and a functional layer disposed between the first electrode layer and the second electrode layer.

In Example 22a, the subject-matter of Example 21a may optionally further include that the first electrode layer is in direct contact with the memory layer, and that the first electrode layer includes a material configured to attract oxygen from the remanent-polarizable material of the memory layer.

In Example 23a, the subject-matter of Example 21a or 22a may optionally further include that the first electrode layer includes a material including at least one of: Lanthanum, Titan, and/or Tantalum.

In Example 24a, the subject-matter of any one of Examples 21a to 23a may optionally further include that the second electrode layer includes a material including at least one of Platinum (Pt), Iridium (Ir), Rhenium (Re), Rhodium (Rh), Ruthenium (Ru), Titanium (Ti), Osmium (Os), Molybdenum (Mo), Chromium (Cr), Tungsten (W), Aluminum (Al), Gold (Au), Cobalt (Co).

In Example 25a, the subject-matter of any one of Examples 21a to 24a may optionally further include that the functional layer is an oxygen absorbing layer or an oxygen diffusion barrier layer.

In Example 26a, the subject-matter of any one of Examples 21a to 25a may optionally further include that functional layer is configured to reduce or prevent an oxygen diffusion from the first electrode layer into the second electrode layer.

In Example 27a, the subject-matter of any one of Examples 1a to 26a may optionally further include that the first electrode, the second electrode, and the memory structure form a capacitive memory structure.

In Example 28a, the subject-matter of any one of Examples 1a to 27a may optionally further include a field-effect transistor structure. The field-effect transistor structure may include a gate structure coupled to the capacitive memory structure, or the capacitive memory structure may be integrated in a field-effect transistor structure.

In Example 29a, the subject-matter of Example 28a may optionally further include that the capacitive memory structure and the field-effect transistor structure are coupled with one another to form a capacitive voltage divider.

In Example 30a, the subject-matter of Example 28a or 29a may optionally further include that the gate structure of the field-effect transistor structure includes a gate electrode and a gate isolation separating the gate electrode from a channel region of the field-effect transistor structure, wherein the gate electrode is coupled to the first electrode of the capacitive memory structure.

In Example 31a, the subject-matter of Example 30a may optionally further include that the gate isolation extends from the channel region of the field-effect transistor structure to the gate electrode of the field-effect transistor structure.

In Example 32a, the subject-matter of any one of Examples 29a to 31a may optionally further include that the field-effect transistor structure includes a gate electrode layer and wherein the first electrode of the memory capacitor and the gate electrode layer are spatially separated from one another and electrically conductively connected to one another.

In Example 33a, the subject-matter of any one of Examples 1a to 32a may optionally further include that a material of the one or more remanent-polarizable layers includes at least one of the following: hafnium oxide, zirconium oxide, a mixture of hafnium oxide and zirconium oxide.

Example 1b is a memory cell, including: a first electrode, a second electrode, and a memory layer disposed between the first electrode and the second electrode, wherein the memory layer includes two or more memory portions and one or more separation portions disposed between the two or more memory portions, wherein each of the two or more memory portions includes a remanent-polarizable material based on at least one metal oxide, wherein each of one or more separation portions includes a metal oxide that has a different chemical composition than the at least one metal oxide.

Another Example 1b is a memory cell, including: a first electrode, a second electrode, and a memory layer disposed between the first electrode and the second electrode, wherein the memory layer includes two or more memory portions and one or more separation portions disposed between the two or more memory portions, wherein each of the two or more memory portions includes a remanent-polarizable material including one or more first metal oxides, wherein each of one or more separation portions includes a separation material comprising one or more second metal oxides distinct from the one or more first metal oxides.

In some aspects, the separation material may be different from the remanent-polarizable material in at least one of an oxygen content, a stoichiometry, and/or a type of participating elements.

In some aspects, the separation material may include a substantially stoichiometric oxygen content; and the remanent polarizable material may include a sub-stoichiometric oxygen content.

The subject-matter of Example 1b may optionally further include the subject-matter of any one of Examples 1a to 33a, where appropriate.

Example 1c is a memory cell, including: a first electrode, a second electrode, and a memory layer disposed between the first electrode and the second electrode, wherein at least one of the first electrode or the second electrode includes a first electrode layer, a second electrode layer, and a functional layer disposed between the first electrode layer and the second electrode layer, wherein the first electrode layer is in direct contact with a first memory portion of the memory layer, wherein the first electrode layer includes a material having a first oxygen content and the first memory portion includes a remanent-polarizable material having a second oxygen content less than the first oxygen content.

The subject-matter of Example 1c may optionally further include the subject-matter of any one of Examples 1a to 33a, where appropriate.

Example 1d is a memory cell including: a first electrode; a second electrode; and a memory layer disposed between the first electrode and the second electrode, wherein the memory layer includes a first memory portion having a first concentration of oxygen vacancies and a second memory portion having a second concentration of oxygen vacancies different from the first concentration of oxygen vacancies.

In Example 2d, the subject-matter of Example 1d may optionally further include that the second concentration of oxygen vacancies is at least 10 times greater than the first concentration of oxygen vacancies.

In Example 3d, the subject-matter of Example 1d or 2d may optionally further include that at least one of the first concentration or the second concentration of oxygen vacancies is greater than $10^{20}$ vacancies/cm$^3$.

In Example 4d, the subject-matter of any one of Examples 1d to 3d may optionally further include that the first memory portion includes or consists of a first material having a first oxygen content, and the second memory portion includes or consists of a second material having a second oxygen content less than the first oxygen content.

In Example 5d, the subject-matter of Example 4d may optionally further include that the first material includes oxygen and a metal in a first stoichiometric relationship with one another, and that the second material includes oxygen and the metal in a second stoichiometric relationship with one another, the first stoichiometric relationship being different from the second stoichiometric relationship.

In Example 6d, the subject-matter of any one of Examples 1d to 5d may optionally further include that a width of the first memory portion is greater than 5 nm and wherein a thickness of the first memory portion is in the range from about 0.1 nm to about 5 nm, and that a width of the second memory portion is greater than 5 nm a thickness of the second memory portion is in the range from about 0.1 nm to about 5 nm.

In Example 7d, the subject-matter of any one of Examples 1d to 6d may optionally further include a third memory portion having a third concentration of oxygen vacancies, wherein the third concentration of oxygen vacancies is equal to one of the first concentration of oxygen vacancies or the second concentration of oxygen vacancies.

In Example 8d, the subject-matter of any one of Examples 1d to 7d may optionally further include a fourth memory portion having a fourth concentration of oxygen vacancies, wherein the fourth concentration of oxygen vacancies is equal to the other one of the first concentration of oxygen vacancies or the second concentration of oxygen vacancies.

In Example 9d, the subject-matter of any one of Examples 1d to 8d may optionally further include that the first memory portion includes a material having a first crystal structure, and the second memory portion includes a material having a second crystal structure, and that the first crystal structure differs from the second crystal structure in a number of oxygen vacancies in the crystal lattice.

In Example 10d, the subject-matter of any one of Examples 1d to 9d may optionally further include that the memory layer is remanently polarizable or spontaneously polarizable.

In Example 11d, the subject-matter of any one of Examples 1d to 10d may optionally further include that a material of the first memory portion and/or of the second memory portion includes at least one of the following materials as a main component: hafnium oxide, zirconium oxide, a mixture of hafnium oxide and zirconium oxide.

In Example 12d, the subject-matter of any one of Examples 1d to 11d may optionally further include that the first electrode, the second electrode, and the memory layer form a capacitive memory structure.

In Example 13d, the subject-matter of any one of Examples 1d to 12d may optionally further include a field-effect transistor structure. The field-effect transistor structure may include a gate structure coupled to the capacitive memory structure, or the capacitive memory structure may be integrated in a field-effect transistor structure.

In Example 14d, the subject-matter of Example 13d may optionally further include that the field-effect transistor structure and the capacitive memory structure are coupled to one another to form a capacitive voltage divider.

In Example 15d, the subject-matter of Example 13d or 14d may optionally further include that the gate structure of the field effect transistor structure includes a gate electrode and a gate isolation separating the gate electrode from a channel region of the field effect transistor structure, and that the gate electrode is coupled to the first electrode of the capacitive memory structure.

The subject-matter of any one of Examples 1d to 15d may optionally further include the subject-matter of any one of Examples 1a to 33a, where appropriate.

The subject-matter of any one of Examples 1a to 33d may optionally further include the subject-matter of any one of Examples 1d to 15d, where appropriate.

Example 1e is a method of forming a memory cell, the method including: forming a first electrode; forming a memory layer; and forming a second electrode, wherein forming the memory layer includes forming a first memory portion using first process parameters, and forming a second memory portion using second process parameters different from the first process parameters.

In Example 2e, the subject-matter of Example 1e may optionally further include that the first process parameters differ from the second process parameters in at least one of: an oxygen precursor, a pulse time, an oxygen concentration, a partial pressure of oxygen, an oxygen flow, a doping, a processing temperature, and an oxygen plasma treatment.

In Example 3e, the subject-matter of Example 1e or 2e may optionally further include that forming the first memory portion includes forming a material of the first memory portion using a first oxygen precursor, and forming the second memory portion includes forming a material of the second memory portion using a second oxygen precursor different from the first oxygen precursor.

In Example 4e, the subject-matter of Example 3e may optionally further include that the second oxygen precursor has less oxygen content than the first oxygen precursor.

In Example 5e, the subject-matter of any one of Examples 1e to 4e may optionally further include that forming the first memory portion includes forming a material of the first memory portion using a first pulse time for depositing an oxygen precursor, and that forming the second memory portion includes forming a material of the second memory portion using a second pulse time for depositing an oxygen precursor different from the first pulse time.

In Example 6e, the subject-matter of Example 5e may optionally further include that the second pulse time is less than the first pulse time.

In Example 7e, the subject-matter of any one of Examples 1e to 6e may optionally further include that forming the first memory portion includes forming a material of the first memory portion using a first oxygen flow, and that forming the second memory portion includes forming a material of the second memory portion using a second oxygen flow different from the first oxygen flow.

In Example 8e, the subject-matter of Example 7e may optionally further include that the second oxygen flow is less than the first oxygen flow.

In Example 9e, the subject-matter of any one of Examples 1e to 8e may optionally further include that forming the first memory portion includes forming a material of the first memory portion using a first partial pressure of oxygen, and that forming the second memory portion includes forming a material of the second memory portion using a second partial pressure of oxygen different from the first partial pressure of oxygen.

In Example 10e, the subject-matter of Example 9e may optionally further include that the second partial pressure of oxygen is less than the first partial pressure of oxygen.

In Example 11e, the subject-matter of any one of Examples 1e to 10e may optionally further include that forming the second memory portion includes forming a material of the second memory portion includes forming a material of the second memory portion introducing at least one dopant element.

In Example 12e, the subject-matter of any one of Examples 1e to 11e may optionally further include that forming the first memory portion includes a first processing temperature and that forming the second memory portion includes a second processing temperature different from the first processing temperature.

In Example 13e, the subject-matter of Example 12e may optionally further include that the second processing temperature is greater than the first processing temperature.

In Example 14e, the subject-matter of any one of Examples 1e to 13e may optionally further include that forming the second memory portion includes performing an anneal step at a temperature configured to drive oxygen out of the second memory portion.

In Example 15e, the subject-matter of any one of Examples 1e to 11e may optionally further include that forming the first memory portion includes using a first precursor gas and forming the second memory portion includes using a second precursor gas different from the first precursor gas.

In Example 16e, the subject-matter of Example 15e may optionally further include that the second precursor gas includes an oxygen plasma.

In Example 17e, the subject-matter of any one of Examples 1e to 16e may optionally further include that at least one of forming the first electrode or forming the second electrode may include forming a first electrode layer using first process parameters and forming a second electrode layer using second process parameters different from the first process parameters.

In Example 18e, the subject-matter of Example 17e may optionally further include that forming the first electrode layer includes using a different precursor material with respect to forming the second electrode layer.

In Example 19e, the subject-matter of Example 17e or 18e may optionally further include that forming the first electrode layer includes using at least one of La, Ti, Ta as precursor material.

In Example 20e, the subject-matter of any one of Examples 17e to 19e may optionally further include forming a functional layer between the first electrode layer and the second electrode layer, wherein the functional layer is configured as an oxygen diffusion barrier to reduce or prevent an oxygen diffusion from the first electrode layer to the second electrode layer.

Example 1f is a method of forming a memory cell, the method including: forming a first electrode; forming a memory layer; and forming a second electrode, wherein forming the memory layer includes forming a first memory portion using first process parameters, forming a functional portion using second process parameters, and forming a second memory portion using the first process parameters.

The subject-matter of Example 1f may optionally further include the subject-matter of any one of Examples 1e to 20e, where appropriate.

According to various aspects, various properties (e.g., physical properties, chemical properties, etc.) of a first component (e.g., elements, layers, structures, portions, etc.) and a second component may be compared to one another. It may be found that two or more components may be—with reference to a specific property—either equal to each other or different from one another. As a measure, a value that represents such a property may be either equal or not. In general, a skilled person may understand from the context of the application whether two values or properties are equal or not, e.g., usually, if values are in the range of a usual tolerance, they may be regarded equal. However, in some aspects or as long as not otherwise mentioned or understood, two values that differ from one another with at least 1% relative difference may be considered different from one another. Accordingly, two values that differ from one another with less than 1% relative difference may be considered equal to each other.

It may be understood, that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance".

It may be understood, that the physical properties "average grain size" and/or "grain size distribution" may be determined based on various measurements and/or calculations. As an example, a volume-weighted average grain size may be determined by known formulas. In some aspects, an average grain size may be determined by the known linear intercept method. Preferably, a measurement may be performed in accordance with the ASTM E1382 (e.g., as valid from 2015) standard. However, in a thin layer, e.g., in a layer with a thickness below 1 μm, a TEM cross-section image may be used as a basis to determine the "average grain size" and/or "grain size distribution" at least in two dimensions. This two-dimensional determination may allow estimating or deducting the three-dimensional properties assuming, for example, that a two-dimensional image is (statistically) representative for substantially all directions in the layer. It may be understood, that the term "grain size distribution" may define a spatial distribution, e.g., a distribution along a line, in a plane, or in a volume. It may be understood, that the term "grain size distribution" may define a frequency distribution, e.g., a histogram including number of grains having a grain-size in a certain range.

It may be understood, that the term "density of grain boundaries" may be defined by a number of grain boundaries per volume and/or by a volume fraction comparing the volume of the grain boundaries with a reference volume.

It may be understood, that the term "chemical composition of grain boundaries" may consider that a grain boundary may include another material than the corresponding grains. As an example, the oxygen content in a grain boundary may be different from the oxygen content of the actual corresponding grains.

It may be understood, that the term "chemical composition of defects" may consider that defects may include impurities. As an example, the material causing impurities may have another chemical composition than the material in the surrounding of the impurities.

It may be understood, that a specific type of crystallinity of a material may be a microstructural property. Type of crystallinity may include, for example: single crystalline, poly-crystalline, nano-crystalline, and, as an edge case, amorphous structures, as examples.

The term "metal material" may be used herein to describe a metal (e.g., a pure or substantially pure metal), a mixture of more than one metal, a metal alloy, an intermetallic material, a conductive metal compound (e.g., a nitride), and the like. Illustratively, the term "metal material" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band.

The terms "electrically conducting" or "electrically conductive" may be used herein interchangeably to describe a material or a layer having an electrical conductivity or an average electrical conductivity greater than $10^6$ S/m at a temperature of 20° C. The term "electrically insulating" may be used herein interchangeably to describe a material or a layer having an electrical conductivity or an average electrical conductivity less than $10^{-10}$ S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least $10^{15}$ S/m at a temperature of 20° C.

The term "content" may be used herein, in some aspects, in relation to the "content of an element" in a material or in a layer to describe the mass percentage (or fraction) of that element over a total mass of the material (or of the layer). The term "content" may be used herein in relation to the "content of defects" in the structure of a material to describe the mass percentage of the defects over a total mass of the constituents of the structure. The term "content" may be used herein, in some aspects, in relation to the "content of an element" in a material or in a layer to describe the volume percentage of that element over a total volume of the material (or of the layer). The term "content" may be used herein in relation to the "content of defects" in the structure of a material to describe the volume percentage of the defects over a total volume of the structure.

The expression "a material of a layer" or "a material of a portion", for example "a material of an electrode layer" or "a material of a memory portion", may be used herein to describe a main component of that layer or portion, e.g. a main material (for example, a main element or a main compound) present in that layer or portion. The term "a material of a layer" or "a material of a portion" may describe, in some aspects, the material of that layer or portion having a weight percentage greater than 60% over the total weight of the materials that the layer or portion includes. The term "a material of a layer" or "a material of a portion" may describe, in some aspects, the material of that layer or portion having a volume percentage greater than 60% over the total volume of the materials that the layer or portion includes. As an example, a material of a layer or portion including aluminum may describe that that layer or portion is formed mostly by aluminum, and that other elements (e.g., impurities) may be present in a smaller proportion, e.g. having less weight percentage or less volume percentage compared to aluminum. As another example, a material of a layer or portion including titanium nitride may describe that that layer or portion is formed mostly by titanium nitride, and that other elements (e.g., impurities) may be present in a smaller proportion, e.g. having less weight percentage or less volume percentage compared to titanium nitride.

According to various aspects, the properties and/or the structure of an electrode, an electrode layer, a memory layer, a memory portion, a separation portion, a ion conductor portion, and/or a functional layer as described herein may be evaluated with techniques known in the art. As an example, transmission electron microscopy (TEM) may be used to determine the structure of a material or a layer, for example the presence of one or more sub-layers in a layer. TEM may be used for identifying a layer, an interface, a crystal structure, a microstructure, and other properties. As another example, X-ray crystallography (X-ray diffraction) may be used to determine various properties of a layer or a material, such as the crystal structure, the lattice properties, the size and shape of a unit cell, the chemical composition, the phase or alteration of the phase, the presence of stress in the crystal structure, the microstructure, and the like. As a further example, energy-dispersive X-ray spectroscopy (EDS) may be used to determine the chemical composition of a layer or a material, e.g. the presence and/or the content of an element in the layer or material. As a further example, Rutherford backscattering spectrometry (RBS) may be used to determine the structure and/or the composition of a material. As a further example, secondary ion mass spectrometry (SIMS) may be used to analyze the molecular composition of the upper monolayers of a solid, e.g. for analyzing the spatial distribution (e.g., the gradient) of an element across the solid. As a further example, neutron diffraction (also referred to as elastic neutron scattering) may be used to determine the atomic structure of a material.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell comprising:
a first electrode;
a second electrode; and
a memory layer disposed between the first electrode and the second electrode, wherein the memory layer is spontaneously polarizable and comprises an oxygen containing memory material,
wherein the memory layer comprises a first memory portion having a first concentration of oxygen vacancies and a second memory portion having a second concentration of oxygen vacancies less than the first concentration of oxygen vacancies,
wherein a material of the first memory portion and/or of the second memory portion comprises one of the following as a main component:
hafnium oxide; or
a mixture of hafnium oxide and zirconium oxide,
wherein at least one of the first electrode and the second electrode comprises:
an electrode layer in direct contact with the first memory portion of the memory layer, a further electrode layer, and a functional layer disposed between the electrode layer and the further electrode layer, wherein the electrode layer contains oxygen and wherein the functional layer is configured to inhibit diffusion of the oxygen from the electrode layer into the further electrode layer.

2. The memory cell according to claim 1, wherein the electrode layer in direct contact with the first memory portion includes a greater concentration of oxygen than the first memory portion.

3. The memory cell according to claim 1, wherein the functional layer comprises chromium and/or ruthenium.

4. The memory cell according to claim 1, wherein the functional layer is configured to absorb oxygen into the functional layer by forming an oxide of a material comprised in the functional layer.

5. The memory cell according to claim 1, wherein the functional layer is an electrically conductive oxygen barrier.

6. The memory cell according to claim 1, wherein functional layer comprises an electrically conductive oxide material or an electrically conductive nitride material.

7. The memory cell according to claim 1, wherein the second concentration of oxygen vacancies is at least 10 times greater than the first concentration of oxygen vacancies.

8. The memory cell according to claim 1, wherein the first memory portion comprises a first material having a first oxygen content, and the second memory portion comprises a second material having a second oxygen content less than the first oxygen content.

9. The memory cell according to claim 8, wherein the first material comprises oxygen and a metal in a first stoichiometric relationship with one another, and
wherein the second material comprises oxygen and the metal in a second stoichiometric relationship with one another, the first stoichiometric relationship being different from the second stoichiometric relationship.

10. The memory cell according to claim 1, wherein the first memory portion comprises a material having a first crystal structure, and the second memory portion comprises a material having a second crystal structure,
wherein the first crystal structure differs from the second crystal structure in a number of oxygen vacancies in the crystal lattice.

11. The memory cell according to claim 1, wherein the memory layer is remanently polarizable.

12. The memory cell according to claim 1,
wherein the first electrode, the second electrode, and the memory layer form a capacitive memory structure.

13. The memory cell according to claim 1, wherein the memory layer further comprises one or more ion conductor portions, wherein the one or more ion conductor portions are disposed between the first and second memory portions.

14. The memory cell according to claim 13, where each of one or more ion conductor portions is configured to allow an exchange of oxygen ions between the first and second memory portions.

15. The memory cell according to claim 13,
wherein each of the one or more ion conductor portions comprises a material that is both electrically insulating and capable of conducting oxygen ions.

16. The memory cell according to claim 1,
wherein the memory layer further comprises one or more separation portions disposed between the first memory portion and the second memory portion, wherein each of the first and second memory portions comprises a remanent-polarizable material comprising a first metal oxide, wherein each of the one or more separation portions comprises a separation material comprising a second metal oxide that has a different stoichiometry than the first metal oxide.

* * * * *